US012005445B2

(12) United States Patent
Xin et al.

(10) Patent No.: US 12,005,445 B2
(45) Date of Patent: Jun. 11, 2024

(54) MICRO-PUMP FLUIDIC STRATEGY FOR FABRICATING PEROVSKITE MICROWIRE ARRAY-BASED DEVICES ON SEMICONDUCTOR PLATFORMS AND METHOD

(71) Applicant: KING ABDULLAH UNIVERSITY OF SCIENCE AND TECHNOLOGY, Thuwal (SA)

(72) Inventors: Bin Xin, Thuwal (SA); Iman S. Roqan, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 355 days.

(21) Appl. No.: 17/323,228

(22) Filed: May 18, 2021

(65) Prior Publication Data

US 2021/0354136 A1 Nov. 18, 2021

Related U.S. Application Data

(60) Provisional application No. 63/026,297, filed on May 18, 2020.

(51) Int. Cl.
*G01N 33/68* (2006.01)
*A01N 1/02* (2006.01)
(Continued)

(52) U.S. Cl.
CPC ........ *B01L 3/502715* (2013.01); *B81B 1/006* (2013.01); *B81C 1/00119* (2013.01);
(Continued)

(58) Field of Classification Search
CPC .......... B01L 3/502715; B01L 2200/10; B01L 2300/0663; B01L 2300/0819;
(Continued)

(56) References Cited

U.S. PATENT DOCUMENTS

2012/0256160 A1* 10/2012 Wang ............... H01L 29/872
257/E29.069
2016/0139069 A1* 5/2016 Wang ................. B01L 3/50273
438/49

(Continued)

OTHER PUBLICATIONS

Lee, Lynn, et al. "Wafer-scale single-crystal perovskite patterned thin films based on geometrically-confined lateral crystal growth." Nature communications 8.1 (2017): 15882. (Year: 2017).*

(Continued)

*Primary Examiner* — Jennifer Wecker
*Assistant Examiner* — Oyeleye Alexander Alabi
(74) *Attorney, Agent, or Firm* — PATENT PORTFOLIO BUILDERS PLLC

(57) ABSTRACT

A method for making ion-crystal semiconductor material based micro- and/or nanowires, MNWs, embedded into a semiconductor substrate, includes forming a structure into the semiconductor substrate, wherein the structure has each of a width and a depth less than 10 μm; pumping an ion-crystal semiconductor material as an ion solution into the structure, wherein the pumping is achieved exclusively due to capillary forces; flowing the ion solution through the structure to fill the structure; crystallizing the ion-crystal semiconductor material inside the structure to form the MNWs; and adding electrodes to ends of the MNWs.

7 Claims, 17 Drawing Sheets

(51) Int. Cl.

| | |
|---|---|
| *B01L 3/00* | (2006.01) |
| *B81B 1/00* | (2006.01) |
| *B81C 1/00* | (2006.01) |
| *C07C 309/65* | (2006.01) |
| *C07C 309/73* | (2006.01) |
| *F04B 43/12* | (2006.01) |
| *G01N 1/40* | (2006.01) |
| *G01N 21/33* | (2006.01) |
| *G01N 21/64* | (2006.01) |
| *G01N 33/52* | (2006.01) |
| *G01N 35/10* | (2006.01) |

(52) U.S. Cl.
CPC ... *B01L 2200/10* (2013.01); *B01L 2300/0663* (2013.01); *B01L 2300/0819* (2013.01); *B81B 2201/05* (2013.01); *B81B 2203/033* (2013.01); *B81B 2203/0338* (2013.01); *B81B 2203/04* (2013.01); *B81C 2201/0197* (2013.01)

(58) Field of Classification Search
CPC ....... B01L 2300/0896; B01L 3/502707; B81B 1/006; B81B 2201/05; B81B 2203/033; B81B 2203/0338; B81B 2203/04; B81C 1/00119; B81C 2201/0197; H01L 31/032; H01L 31/035227
See application file for complete search history.

(56) References Cited

U.S. PATENT DOCUMENTS

2020/0295284 A1* 9/2020 Kim ..................... H10K 71/231
2020/0328694 A1* 10/2020 Telefus ............. H02J 13/00007

OTHER PUBLICATIONS

Cho, Namchul, et al. "Pure crystal orientation and anisotropic charge transport in large-area hybrid perovskite films." Nature communications 7.1 (2016): 13407. (Year: 2016).*

Dai, Z., et al., "Capillary-bridge mediated assembly of aligned perovskite quantum dots for high-performance photodetectors," Journal of Materials Chemistry C, vol. 7, 2019 (Published Apr. 18, 2019), pp. 5954-5961.

Deng, W., et al., "A Microchannel-Confined Crystallization Strategy Enables Blade Coating of Perovskite Single Crystal Arrays for Device Integration," Advanced Materials, vol. 32, Article No. 1908340, 2020 (Published online Mar. 4, 2020), pp. 1-9.

Feng, J., et al., "'Liquid Knife' to Fabricate Patterning Single-Crystalline Perovskite Microplates toward High-Performance Laser Arrays," Advanced Materials, vol. 28, 2016 (Published online Mar. 22, 2016), pp. 3732-3741.

Gao, H., et al., "Capillary-Bridge Mediated Assembly of Conjugated Polymer Arrays toward Organic Photodetectors," Advanced Functional Materials, vol. 27, Article No. 1701347, 2017 (Published online Jul. 31, 2017), pp. 1-8.

Maculan, G., et al., "$CH_3NH_3PbCl_3$, Single Crystals: Inverse Temperature Crystallization and Visible-Blind UV-Photodetector," The Journal of Physical Chemistry Letters, vol. 6, Sep. 2, 2015, pp. 3781-3786.

Shi, D., et al., "Low trap-state density and long carrier diffusion in organolead trihalide perovskite single crystals," Science, vol. 347, Jan. 30, 2015, pp. 519-522 (33 pages total).

Song, J., et al., "Monolayer and Few-Layer All-Inorganic Perovskites as a New Family of Two-Dimensional Semiconductors for Printable Optoelectronic Devices," Advanced Materials, vol. 28, 2016 (Published online Apr. 25, 2016), pp. 4861-4869.

Sutherland, B.R., et al., "Perovskite photonic sources," Nature Photonics, vol. 10, May 2016 (Published online Apr. 28, 2016), pp. 295-302.

Veldhuis, S.A., et al., "Perovskite Materials for Light-Emitting Diodes and Lasers," Advanced Materials, vol. 28, 2016 (Published online May 23, 2016), pp. 6804-6834.

Wang, Y., et al., "Patterned Wettability Surface for Competition-Driving Large-Grained Perovskite Solar Cells," Advanced Energy Materials, vol. 9, Article No. 1900838, 2019 (Published online May 21, 2019), pp. 1-8.

Wu, W., et al., "Flexible Photodetector Arrays Based on Patterned $CH_3NH_3PbI_{3-x}Cl_x$ Perovskite Film for Real-Time Photosensing and Imaging," Advanced Materials, vol. 31, Article No. 1805913, 2019 (Published online Nov. 28, 2018), pp. 1-7.

Xin, B., et al., "Self-Patterned $CsPbBr_3$ Nanocrystals for High-Performance Optoelectronics," ACS Applied Materials & Interfaces, vol. 11, Jan. 8, 2019, pp. 5223-5231.

Yan, C., et al., "Liquid bridge induced assembly (LBIA) strategy: Controllable one-dimensional patterning from small molecules to macromolecules and nanomaterials," Nano Today, vol. 25, 2019 (Available online Mar. 14, 2019), pp. 13-26.

Zaher, A., et al., "Osmotically driven drug delivery through remote-controlled magnetic nanocomposite membranes," Biomicrofluidics, vol. 9, No. 5, 2015 (Published online Sep. 29, 2015), pp. 054113-1-054113-16 (17 pages total).

Zhang, H., et al., "Perovskite Photovoltaics: The Significant Role of Ligands in Film Formation, Passivation, and Stability," Advanced Materials, vol. 31, Article No. 1805702, 2019 (Published online Jan. 2, 2019), pp. 1-29.

Zhou, Q., et al., "Nanochannel-Assisted Perovskite Nanowires: From Growth Mechanisms to Photodetector Applications," ACS Nano, vol. 12, Jun. 29, 2018, pp. 8406-8414.

* cited by examiner

MICRO-PUMP FLUIDIC STRATEGY FOR FABRICATING PEROVSKITE MICROWIRE ARRAY-BASED DEVICES ON SEMICONDUCTOR PLATFORMS AND METHOD

This application claims priority to U.S. Provisional Patent Application No. 63/026,297, filed on May 18, 2020, entitled "MICRO-PUMP FLUIDIC STRATEGY FOR FABRICATING PEROVSKITE MICRO-WIRE ARRAY-BASED DEVICES EMBEDDED IN SEMICONDUCTOR PLATFORM," the disclosure of which is incorporated herein by reference in its entirety.

BACKGROUND

Technical Field

Embodiments of the subject matter disclosed herein generally relate to a system and method for forming a perovskite and other liquid-processed material microwire and nanowire array-based device embedded into a semiconductor platform, and more particularly, to using a micro-pump fluidic strategy for forming the microwire array-based device.

Discussion of the Background

In the past few decades, micro-/nanofluidic technologies have played an important role in biological and medical diagnostics and biochemical research, leading to cutting-edge technologies such as lab-on-a-chip (LOC) devices. These advanced processes can be used to precisely manipulate both the fluid flow (e.g., solvents) and mass transport of small molecules (solutes) at a micro-/nanoscale in semiconductor platforms, thereby facilitating the manufacture of millions of microchannels, each measuring mere micrometers, on a single chip. However, as the material required for the application of this technology must be in fluid form, limited progress has been made in this field over the years, necessitating further work on advancing the control method to make it applicable to semiconductor materials.

Recently, lead-halide-based perovskites ($MaPbX_3$ and $CsPbX_3$), as a new type of ion-crystal semiconductor material, have attracted considerable research interest because they can be synthesized by low-cost solution processing at room temperature and because of their unique characteristics, such as high-quantum yield (up to 90%), tunable emission spectra over the entire visible range with narrow linewidth, suppressed photoluminescence (PL) blinking, high carrier mobility, and large diffusion length [1-5]. Thus, perovskite materials have emerged as suitable candidates for a wide range of electronic, optoelectronic, and photovoltaic applications.

Perovskite can be integrated into other semiconductor devices to obtain different functionalities, such as adjusting the charge carrier separation, enhancing light capture, and optimizing the optical parameters of these devices. Integrating patterned nanoscale perovskite structures into semiconductor-based miniaturized devices is especially used for fabricating lasers, solar cells, and photodetectors (PDs) due to their characteristics—in particular, their high surface-to-volume ratio, which results in high sensitivity, rapid response time, and low power consumption. For example, functionalizing Si with perovskite has been demonstrated for developing tandem solar cell devices, using perovskite film structure. Patterned structures based on a wide range of traditional materials, such as Si, conducting polymers, metal oxides, and other semiconductors have already been obtained; nonetheless, it is still challenging to obtain patterned ion semiconductor crystals such as perovskite using the traditional lithography technology to be integrated with semiconductor devices. Note that an ion-crystal is understood herein to be formed of cations and anions with very large electronegativity differences, such as alkali metals and halides, columns I and VII of the periodic table, respectively.

When perovskites were subjected to conventional solution-based processes aimed at functionalizing them in nanofabricated devices, their dewetting behavior was very difficult to control using drop-casting, spin-coating, or inkjet printing [6]. For example, previously proposed methods for synthesizing patterned polymer and other solution-processed materials, such as the liquid knife method [7], the capillary-bridge method [8, 9], the nano-channel-assisted method [10], the wettability surface control method [11, 12], and the microchannel-confined crystallization strategy [13] are costly and require complex fabrication processes, which necessitate the use of additional tools. Moreover, in these methods, the nanoscale resolution is not optimized, and the excess perovskite remaining after the device fabrication cannot be recycled.

Thus, there is still a need for a cost-effective, simple, and feasible approach that can produce waste-free, one-dimensional (1D) microwire (MW) arrays of perovskite with nanometer dimensions, which are embedded in a semiconductor platform.

BRIEF SUMMARY OF THE INVENTION

According to an embodiment, there is a method for making ion-crystal semiconductor material based micro- and/or nanowires, MNWs, embedded into a semiconductor substrate. The method includes forming a structure into the semiconductor substrate, wherein the structure has each of a width and a depth less than 10 µm; pumping an ion-crystal semiconductor material as an ion solution into the structure, wherein the pumping is achieved exclusively due to capillary forces; flowing the ion solution through the structure to fill the structure; crystallizing the ion-crystal semiconductor material inside the structure to form the MNWs; and adding electrodes to ends of the MNWs.

According to another embodiment, there is a lab-on-chip device that includes a semiconductor substrate, a power source integrated into the semiconductor substrate, a sensor integrated into the semiconductor substrate, and a processor integrated into the semiconductor substrate. The processor is configured to receive a measurement from the sensor and the power source is configured to supply electrical power to the sensor and the processor. Each of the power source, the sensor, and the processor includes plural micro- and/or nanowires, MNWs, formed inside corresponding plural micro-channels formed to the semiconductor substrate, and each of a width and a depth of each micro-channel of the plural micro-channels is less than 10 µm.

In yet another embodiment, there is a method for making a liquid-processed material based micro- and/or nanowires, MNWs, embedded into micro-channels formed on a semiconductor substrate. The method includes forming a structure on the semiconductor substrate, wherein the structure has each of a width and a depth less than 10 µm; pumping a liquid-processed material as an ion solution into the structure, wherein the pumping is achieved exclusively due to capillary forces; flowing the ion solution through the structure to fill the structure; crystallizing the liquid-processed material inside the structure to form the MNWs; and adding electrodes to ends of the MNWs.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a specific perovskite material that is embedded as microwires in a semiconductor structure. However, the embodiments to be discussed next are not limited to a single perovskite material, or to a semiconductor structure, but may be applied to other ion-crystal materials or to any liquid based material that can be transformed in a solid material. In one application, a different material is deposited on the semiconductor substrate and the micro- or nanochannels are formed in this material, which may be, for example, a metal-oxide frame.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a micro-/nano-fluidic method relies on a micro-pump auxiliary strategy to obtain well-aligned ion-crystals (e.g., perovskite) micro- and/or nano-wires (MNWs) embedded inside patterned semiconductor (e.g., Si) micro-channels (thousands of microchannels). These micro-channels are fabricated, in one application, by cost-effective, mask-free, laser interference lithography (LIL). The proposed method produces high-resolution (in hundreds of nanometers) MWs, while ensuring uniform control of the crystal size, with the potential for application in integrated circuits in a chip. In one embodiment, which is discussed later, a high-performance photodetector (PD) based on $CsPbBr_3$ MNWs integrated into a patterned $SiO_2$/Si platform is disclosed, confirming that it can be extended to large-scale microwire applications, as it is inexpensive, highly efficient, and flexible.

Figure 1A:
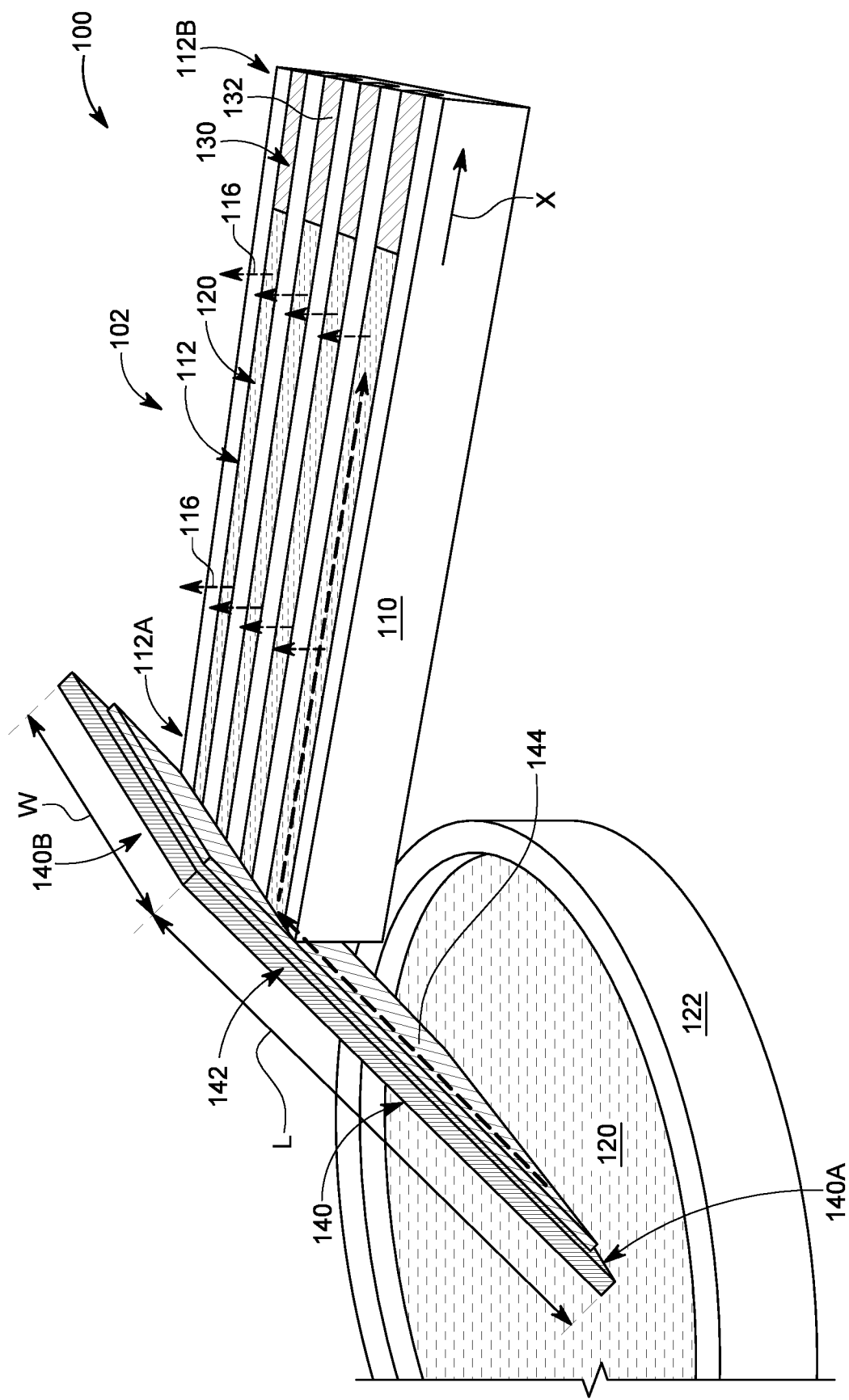
FIG. 1A is a schematic diagram of MWs embedded platform that is achieved based on a micro-pump fluidic strategy.

FIG. 1A shows a micro/nano-pumping system 100 for fabricating MWs of solution-processed ion-crystal semiconductor material (e.g., perovskite) that subsequently can be embedded in corresponding micro-channels of a patterned semiconductor device. The system 100 includes a microwires embedded platform 102, a micro-pump 140, and a container 122 that holds an ion solution 120, which is later crystalized to form the MWs 132. The microwires embedded platform 102 (herein "the platform") includes a patterned substrate (for example, Si substrate) 110 that has plural micro-channels 112 extending along a longitudinal axis X of the substrate. Although the name of the micro-channels 112 appear to suggest that their size is in the micrometer range, these channels can be as small as possible, for example, in the nanometer range. The micro-channels 112 may be parallel to each other and also they may be formed as a straight line or have different shapes and/or profiles. The ion solution 120, which includes the perovskite material 130 and a solvent, is stored in the container 122. The micro-pump 140 fluidly connects the container 122 to the platform 102 and moves through capillarity the ion solution 120 into the plural micro-channels 112. In this embodiment, the micro-pump 140 has a substrate 142 (for example, made out of glass or plastic, i.e., a solid material) to which a paper filter 144 is attached. The paper filter is usually soft, i.e., bendable and cannot hold its shape without the help of the substrate 142. The paper filter 144 has a myriad of capillaries that feed into the ion solution 120. Due exclusively to the capillarity effect, the ion solution 120 is moved through the paper filter 144 into the micro-channels 112, which means that the length L and the width W of the paper filter are selected depending on the ion crystal semiconductor material used to make sure that the ion solution reaches the micro-channels in an amount that at least replaces an evaporation of a solvent of the ion solution, as discussed later. In one embodiment, a length of the micro-channels may be in the range of micrometers to centimeters, while the width is 10 μm or less, or 1 μm or less, and the height is 10 μm or less or 2 μm or less. Note that other materials may be used instead of the paper filter 144 as long as they provide capillarity force to move the ion solution between the container 122 and the micro-channels 112.

Figure 1B:
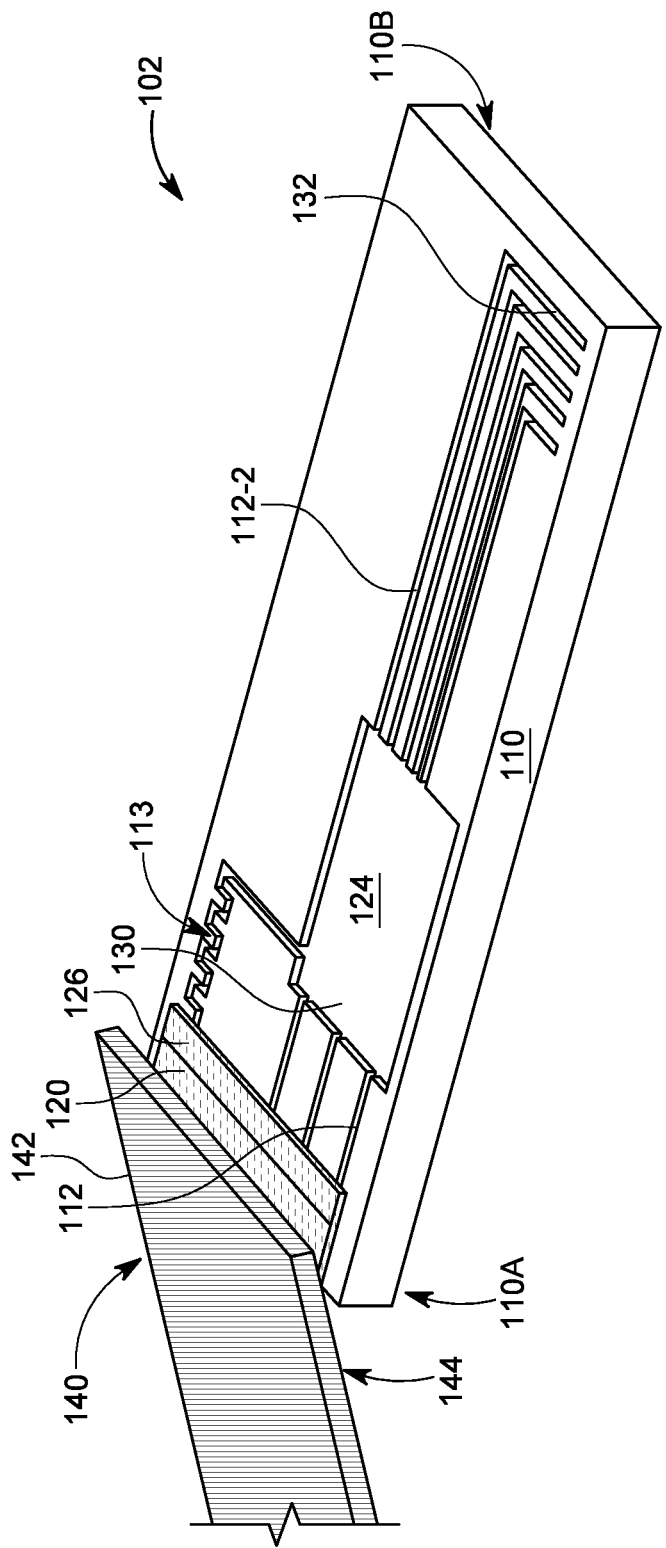
FIG. 1B is a schematic diagram of another MWs embedded platform that includes at least one reservoir.

FIG. 1B shows a more complex platform 102 that has not only the parallel micro-channels 112, but also a non-straight line micro-channels 113, and additional parallel micro-channels 112-2 that are separated from the original micro-channels 112 by a central reservoir 124. Further, the platform 102 may have an inlet reservoir 126 where the ion solution 120 received from the micro-pump 140 is first received. Note that the micro-pump 140 touches a proximal end 110A of the substrate 110. The ion solution 120 is then distributed from the inlet reservoir 126 to the parallel micro-channels 112 and to the non-straight line micro-channel 113. Note that the micro-channel 113 may take any shape. Also, the figure shows for simplicity a single micro-channel 113, but more such micro-channels may be formed. In one application, all these micro-channels feed into the central reservoir 124. The central reservoir may be located anywhere on the substrate 110. The additional micro-channels 112-2 originate from the central reservoir 124 and may extend to the distal end 110B of the substrate. With this structure, more elaborate components may be formed, for example, a solar cell, a laser, a transistor, an integrated circuit, etc.

Figure 2:
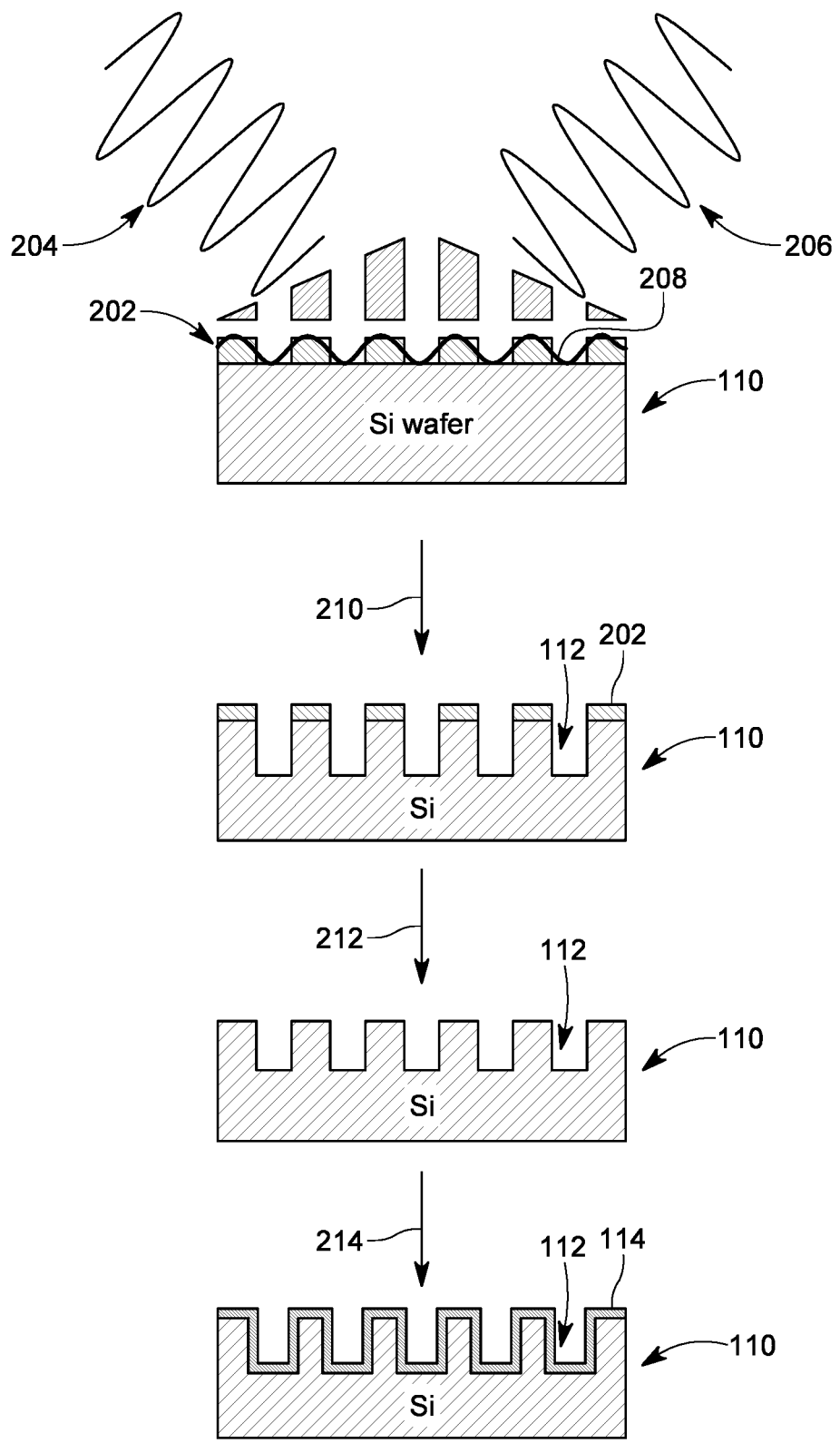
FIG. 2 illustrates the steps of a method for forming plural micro-channels in a semiconductor substrate.

The fabrication of the patterned substrate 110 with periodic line gratings or micro-channels 112 is now discussed with regard to FIG. 2, which schematically illustrates the LIL process. Note that the perovskite material 130 is very brittle and manipulating this material is very difficult. However, with the micro-channels formed in the semiconductor substrate 110, the MWs 130 are directly formed in the mold provided by the micro-channels, and thus, the MWs do not break. LIL is a facile, inexpensive, rapid, and mask-free patterning technique for fabricating periodic and uniform micro-/nanopatterns (e.g., line, dot, hole arrays) across a relatively large substrate area. The LIL performed in this embodiment includes three steps. During the first step, the Si substrate 110 is covered by a photoresist 202. The photoresist was prepared by mixing AZ 2020 negative photoresist and AZ 1500 thinner (at the 1:0.8 ratio) by string for 48 hours. 200 nm of the prepared photoresist was spin coated (at 4000 rpm for 45 s) on an $O_2$ plasma-treated (30 sccm for 1 min) Si wafer 110. After an 80 s soft-bake process at 100° C., the as-coated wafer was transferred to the LIL system for exposure to two interfering laser beams 204 and 206, which were generated with a 26 mW 325 nm He—Cd laser serving as the light source. A beam expander was utilized to generate a larger light spot with a diameter of 12 cm. The line gratings and the period width were determined by the exposure time and the angle of the stage (20 s~25 s was adopted in this embodiment, but other times may be used). The period could be adjusted, while remaining in the 160-2000 nm range. After conducting a further 180 s post-bake at 115° C. to ensure photoresist stability, the AZ762 MIF developer was applied for ~40 s to obtain the desired design pattern 208 shown in the figure. All aforementioned steps were performed in darkroom to avoid ambient light from affecting the photoresist exposure.

Next, for the etching process, a deep-reactive ion Si etch process 210 was applied to create the desired pattern 112 on the Si wafer 110. This etching process used, in one application, 5 s develop step of 100 sccm $C4F_8$, 10 sccm $SF_6$ and 7 s etch step of 5 sccm $C4F_8$, and 100 sccm $SF_6$ alert flow into the etching chamber. Normally, the alert was conducted in 10~20 cycle in the case of 200 nm thickness photoresist. Acetone washing 212 to remove the residuum of photoresist was then performed. Thus, a deeper and stable periodic Si microchannel 112 that can withstand application of most organic solvents is obtained without the need for the unstable conventional photoresist patterning process. Finally, to fabricate an insulating oxide layer 114 on the Si patterned substrate 110, the periodically patterned Si substrate was further subjected to a standard thermal oxidization process 214 to create a thin $SiO_2$ layer 114 on the patterned Si microchannel 112's, as shown in FIG. 2. In one application, the $SiO_2$ layer has a 300 nm thickness and it was deposited on the Si patterned channels/ridges using a standard wet rapid thermal oxidation.

The LIL technique allows the fabrication of different periodic patterns (e.g., holes, pillars, parallel line gratings), by modulating various lithographic parameters, such as interference light intensity, angle, exposure time, and development duration. To obtain the parallel line grating-patterned matrix shown in FIG. 2, a single exposure was performed. However, to obtain an array of periodic hole (or pillar) patterns, a second exposure needs to be performed. The patterned Si substrate 110 made in this embodiment is comprised of a microchannel array that is characterized by about −1 μm channel/ridge periodic pairs with a depth of 1-2 μm. Moreover, the obtained channel depth and width are uniform. A liquid droplet of the ion solution 120 exhibits an anisotropic shape on the parallel line grating-patterned Si surface, demonstrating a guide function for the liquid flow process.

While FIG. 2 illustrates the formation of the micro-channels 112 into the Si based substrate 110, those skilled in the art would understand that there are other materials and/or methods for forming the micro-channels 112. For example, in one application, it is possible to grow a metal-organic frame (MOF) and pattern it on the semiconductor substrate 110 to obtain the micro-channels 112. The patterned MOF can play the role of the transport liquid instead of the Si channels. Thus, it is possible to site-selective growth of metal-organic frameworks using an interfacial growth approach combined with VUV photolithography to achieve the micro-channels 112.

Next, the process of incorporating the perovskite material 130 into the microchannels 112 is discussed. The process includes two stages. The first stage is the injection of the ion solution 120 into the proximal ends 112A of the empty micro-channels 112 through the filter paper 144, while the second stage shows the post-"evaporation-injection-balance" process, when the perovskite MWs 132 are formed, starting at the distal ends 112B of the micro-channels 112.

In this embodiment, the ion solution 120 includes CsBr and $PbBr_2$ dissolved in dimethyl sulfoxide (DMSO) solvent and this composition was placed in the container 122 in FIG. 1A, which serves as a "solution source." Next, the filter paper 144 was placed on a piece of a glass slide 142, to act as the micro-pump 140 to transmit the ion solution 120 from the solvent source 122 (using exclusively the surface tension force) into the proximal end 112A of the parallel micro-channels 112 of the substrate 110. One side/end 140A (see FIG. 1A) of the filter paper/glass pump 140 was dipped in the perovskite source solution 122 and the other side/end 140B was attached to the first ends 112A of the micro-channels 112 of the substrate 110, as shown in FIG. 1A. In several minutes, the filter paper 144 became fully wet and then the DMSO solution injection process (including Cs, Pb, and Br ions) into the micro-channels 112 started by relying solely on the capillary force.

Figure 3A:
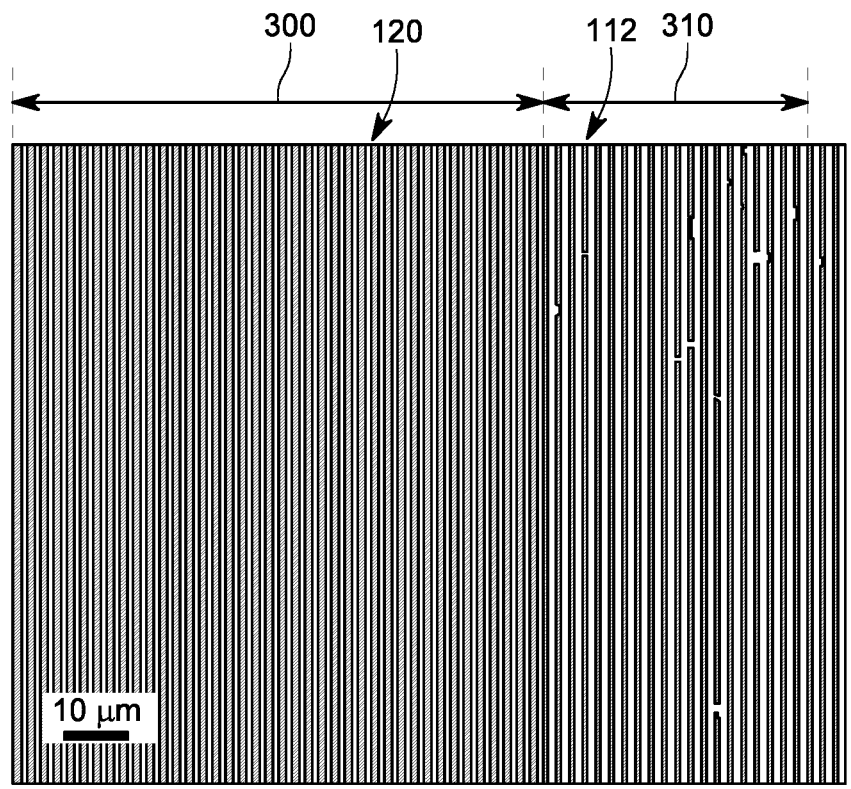
FIG. 3A is a detailed view of the MWs formed inside some of the plural micro-channels of the semiconductor substrate.
Figure 3B:
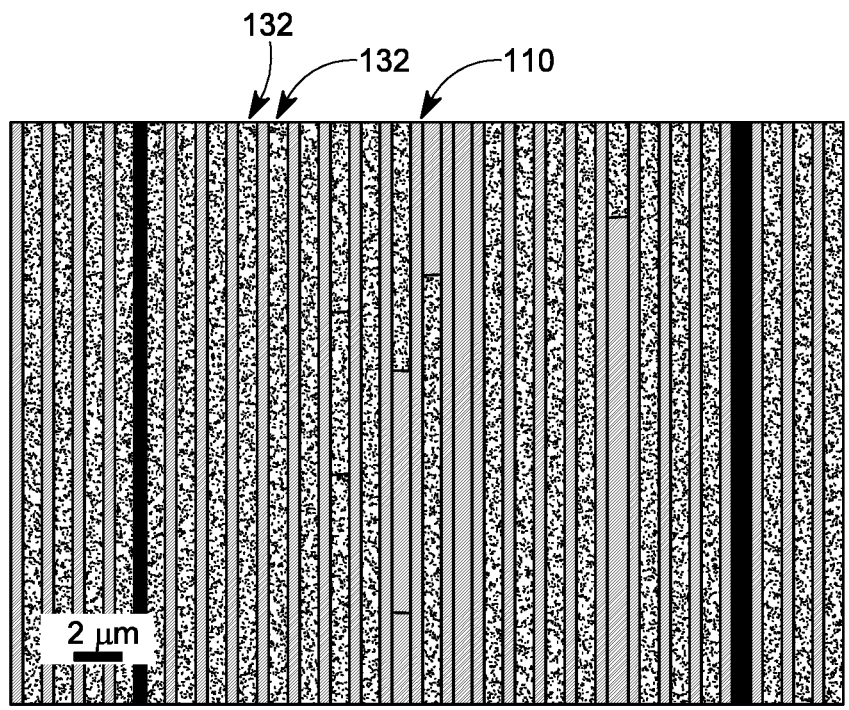
FIG. 3B is a detailed view of the periodic, uniform perovskite MWs embedded in the micro-channels of the substrate.

Due to the high-energy surface of the plasma etched area inside the micro-channels 112 (with more dangling bonds of Si along the etched surface), the liquid solution 120 could thermodynamically adhere to the micro-channel surface. Therefore, the ion solution 120 was fully contained along the micro-channels 112 and had the same level as the ridge height without dips or overflow, as shown in FIG. 3A. Note that the region 300 in FIG. 3A has all the micro-channels 112 filled with the ion solution 120 while the region 310 has the micro-channels empty. After the DMSO solvent evaporated from the ion solution 120 in the micro-channels 112, as schematically illustrated by arrows 116 in FIG. 1A, the remaining $Cs^+$, $Pb^{2+}$, and Br ions in the solvent were clustered and nucleated and crystallized inside the channels 112, forming the perovskite MWs 132, on the patterned Si substrate 110, as shown in FIGS. 1A and 3B. The energy-dispersive X-ray spectroscopy (EDX) elemental maps generated by the inventors for this configuration demonstrates that the elemental compositions (e.g., Cs, Pb, Br) are almost uniformly distributed along the entire periodic array of perovskite MWs. Note that the width of the micro-channels 112 controls the MW 132's width.

The previous embodiments illustrated a growth process of perovskite MWs 132 within the Si micro-channels 112. During the growth process, it was observed that after the micro-channels 112 are filled with the perovskite solution 120, the solution level starts decreasing due to the evaporation 116. The inventors also observed that driven by the capillary forces, as more ion solution 120 is pumped from the solvent source 122, this new ion solution 120 pushes the as-evaporated solution forward to the distal end 112B of the micro-channel 112, which is distal from the pump 140, to compensate for the lost volume. As a result, the ion concentration distribution in the solution gradually increases from the proximal end 112A at which the solution is pumped into the micro-channel toward the distal end 112B. Thus, the perovskite MW 132 crystallization progresses sequentially in the reverse direction, i.e., from the distal end 112B to the proximal end 112A, as indicated by the arrow 410 in FIG. 4, when compared to the direction 412 of the solute flow. The line 414 is the ion concentration axis, indicating a high ion concentration value toward the distal end 112B and a low ion concentration value toward the proximal end 112A of the micro-channel 112. This results in the formation of a perovskite MW 132 confined by two adjacent Si ridges 402 and 404. Note that the dimension of the perovskite MW 132 depends on the micro-channel 112's dimension. Thus, this evaporation technique can be used to form the perovskite MWs 132 as the LIL method was successfully used for producing the nano-channels 112.

Figure 4:
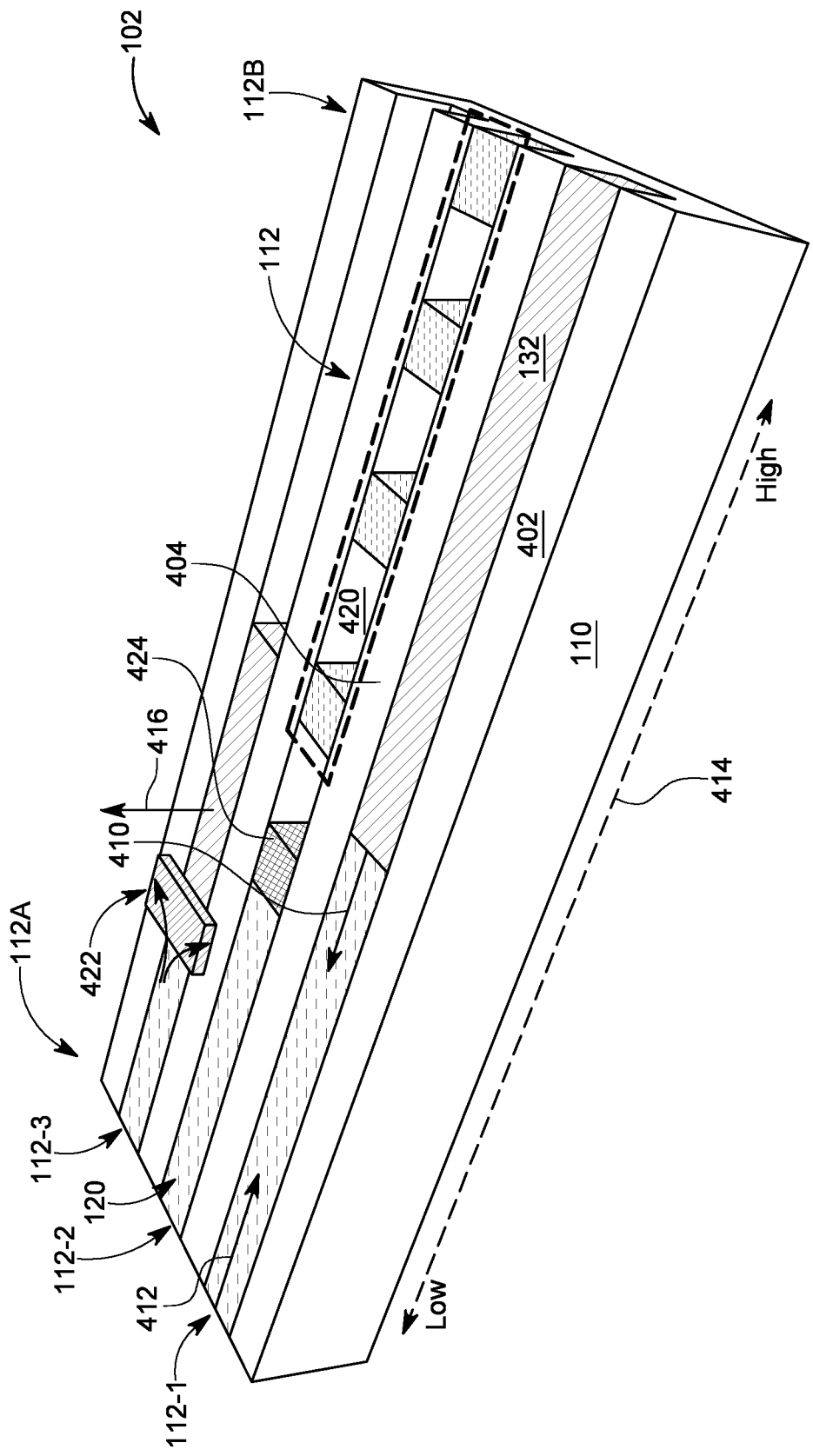
FIG. 4 illustrates a crystallization mechanism of an ion-crystal semiconductor material inside the plural micro-channels and various defects formed in the produced MWs.

To gain insight into the ideal MW growth shown in FIG. 4 in a micro-channel 112-1, a computer simulation of the flow character and ion distribution was performed using the COMSOL software. To simplify the analysis, while retaining the channel width and height (0.72 and 1.5 mm, respectively in this embodiment) used in the experimental setup, the channel length was shortened to 20 mm. At the same time, the amount of the injected solution was regarded as equal to the evaporation amount. The injection direction was from the proximal end 112A of the micro-channel 112, while the evaporation occurred at its top surface, as shown by arrow 416 in FIG. 4. The DMSO solution evaporation rate was found to be about 0.8 $pg/s/mm^2$ at the "evaporation-injection-balance" stage. To show the micro-pump process more clearly, it was assumed that the ions were transported with the solution and had a low diffusion propensity (depending on their density). The initial concentration was set to 225 mmol/L, in line with the experimental value.

Figure 5:
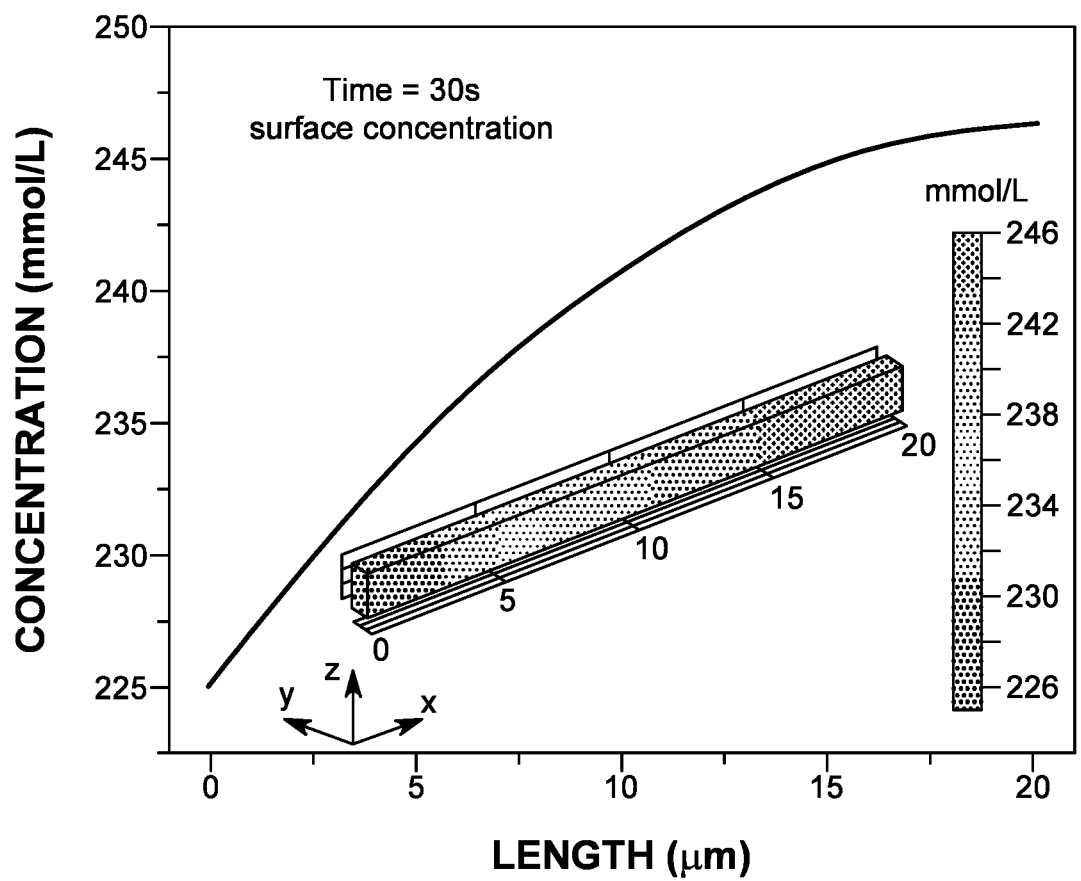
FIG. 5 shows the ion concentration of the ion-crystal semiconductor material distributed inside the micro-channels after 30 s of evaporation.

It was found from the software simulations that the solution velocity exhibits a U shape, whereby the velocity at the center is much greater than that near the channel walls due to the boundary effect. Moreover, the velocity decreases from 16 mm/s at the proximal end 112A of the channel 112 to about 0 at its distal end 112B. At the start of the process (i.e., at t=0 s), the ion concentration is 225 mmol/L and is evenly distributed across the channel 112. As the time passes, the evaporation induces an increase in the ion concentration. Thus, at t=30 s, the ion concentration in the channel 112 has a distribution from 225 mmol/L at the proximal end 112A of the channel 112 (L=0 mm) to 246 mmol/L at its distal end 112B (L=20 mm), as shown in FIG. 5. The higher ion concentration in the channel 112 indicates that the perovskite crystallization starts from the channel's distal end 112B. These simulation results support the hypothesis regarding the ideal growth conditions shown in FIG. 4.

Defects such as discontinuities 420 and overflow defects 422 (the most common defects) as shown in FIG. 4 can appear in the MWs 132. Scanning electron microscopy (SEM) images confirm these different types of defects, including nucleation 424, discontinuities, uneven distribution in the horizontal direction, and overflow. These defects prevent the formation of periodic MWs across a large area of the patterned substrate 110. To avoid the emergence of these defects, it is desired to eliminate random nucleation and properly let the solution 120 flow to the end of the micro-channels 112. Although the LIL allowed the fabrication of the micro-channels 112 with a high length-to-width ratio, accumulation of the perovskite solution 120 can still occur in such a long channel, leading to the aforementioned defects.

Figure 6:
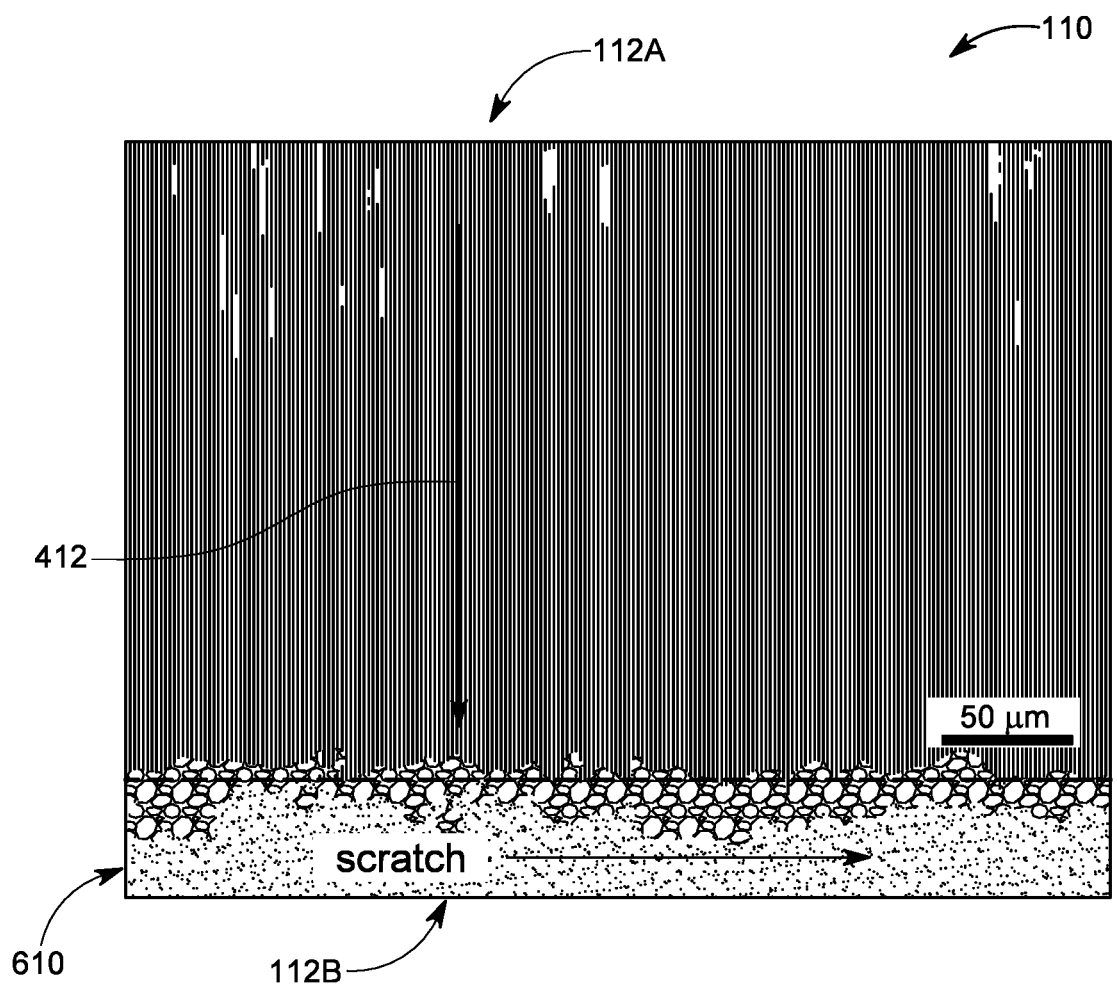
FIG. 6 illustrates an embodiment of the platform obtained by making a line through focused ion beam, perpendicular to the plural micro-channels.
Figure 7:
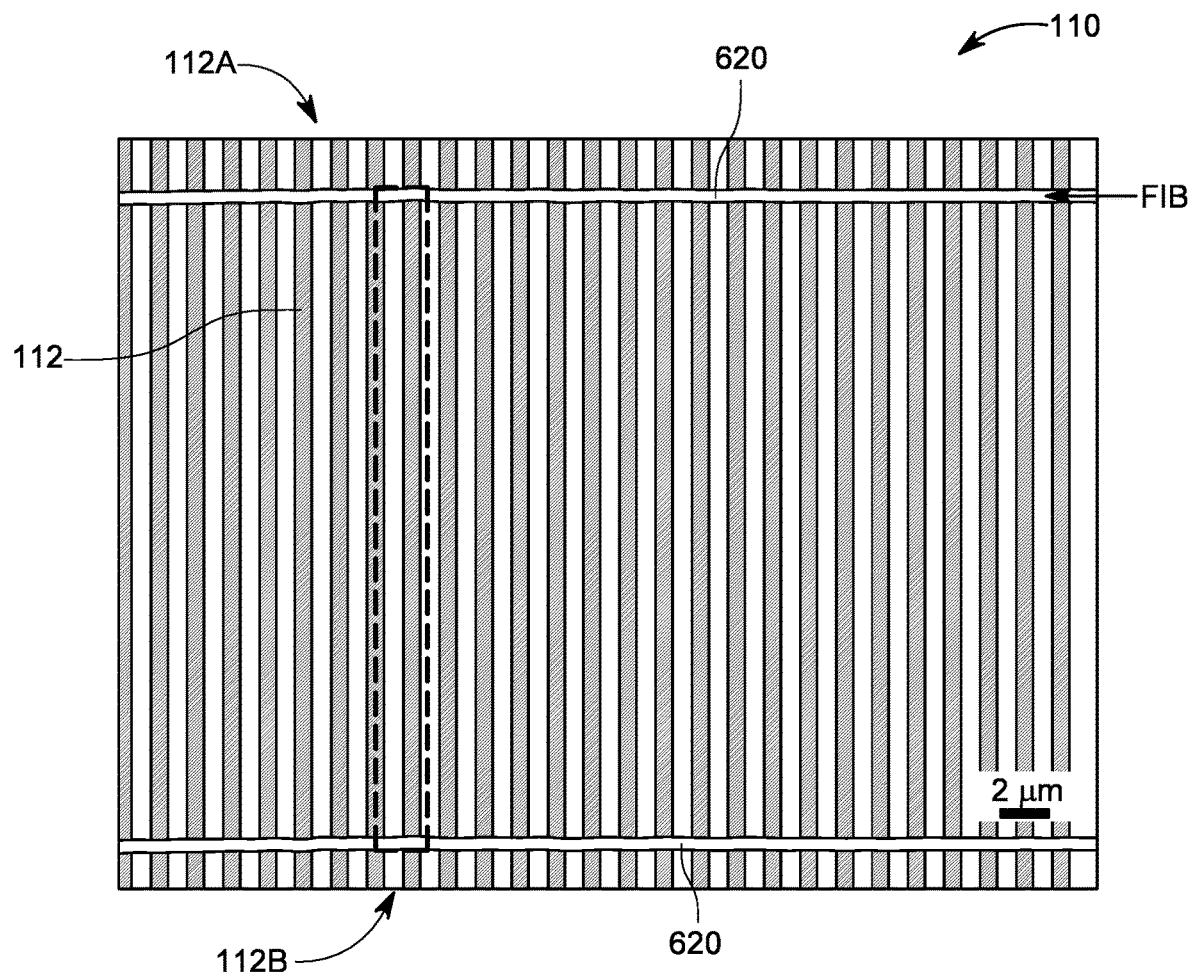
FIG. 7 illustrates another embodiment of the platform after applying more focused ion beam lines perpendicular to the plural micro-channels.

To address these issues, the micro-pump process illustrated in FIG. 1A was modified in this embodiment by using another strategy. The substrate 110 was scratched using a diamond knife, along a direction perpendicular to the Si microchannel arrays 112 (i.e., the liquid flow direction), to form a trench 610, as illustrated in FIG. 6. This scratch was highly effective in releasing the pump force, i.e., offering the ion solution 120 an escape path, and ensuring an even and homogeneous redistribution of the perovskite solution 120 inside the micro-channels 112. To obtain uniform periodic dimensions of MWs, this configuration was further optimized. For example, based on the scratch process, focused ion beam (FIB) lithography was used to delicately form plural lines 620 on the patterned substrate 110, which are perpendicular to the microchannels 112, as shown in FIG. 7. By fabricating these lines 620, an easy-flow and growth strategy was obtained by eliminating discontinuities or overflow defects, resulting in a periodic perovskite MW array 112 with about 100 mm length at an area of several centimeters (i.e., 500-nm width was achieved for a single MW). As the MW dimensions depend on the micro-channel's dimensions using this micro-pump process, the MW height is determined by the micro-channel's depth, which is limited by the photoresist thickness. However, theoretically, the MW length is expected to be flexible (up to several centimeters), but may be controlled by the defect presence.

Figure 8:
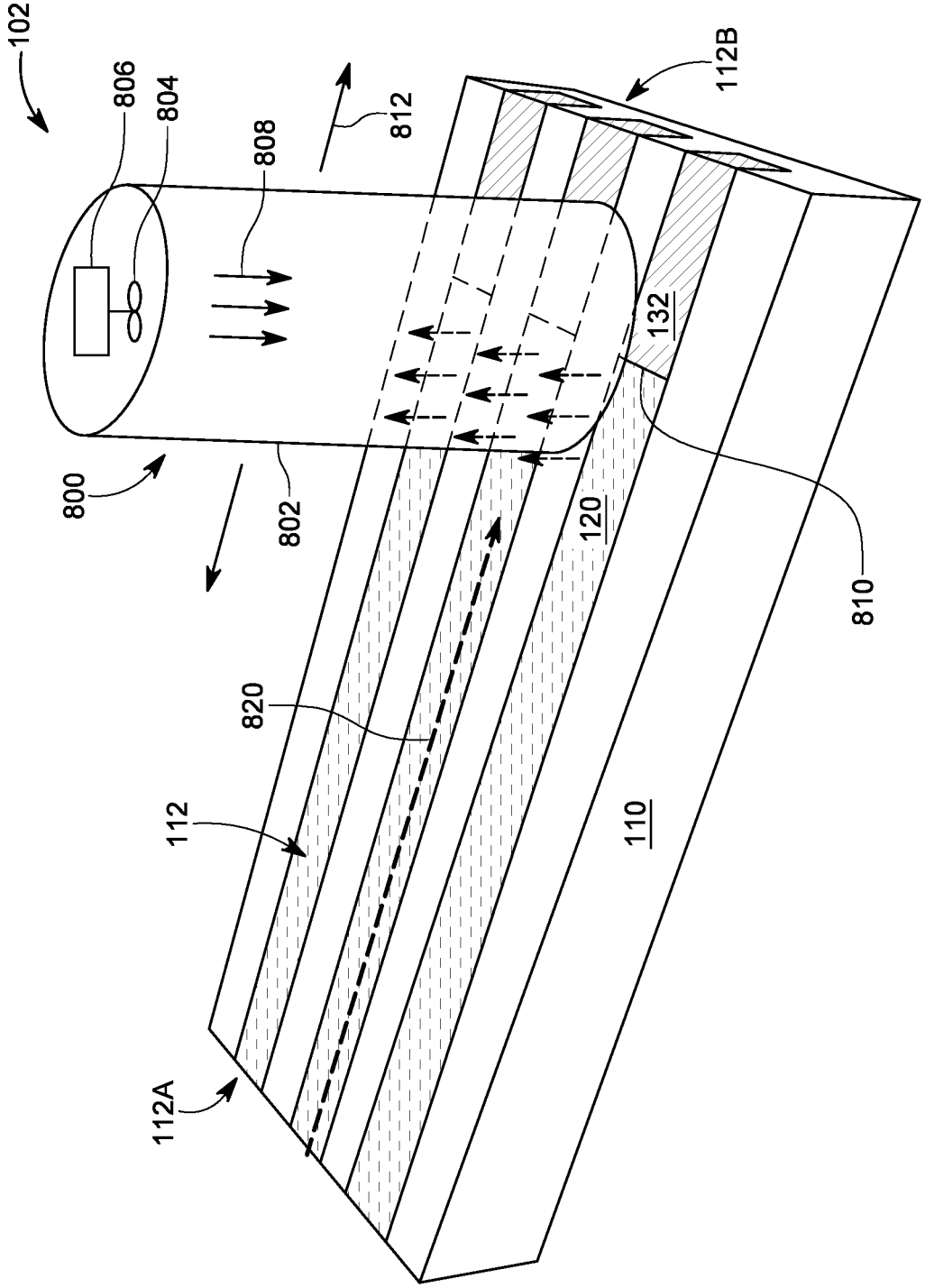
FIG. 8 illustrates an embodiment in which an evaporation rate of a solvent at an interface between an ion solution and a crystalized microwire is controlled.

Another method to further improve the quality of the perovskite/Si platform 102 for use in practical devices is now discussed with regard to FIG. 8. To further optimize the proposed micro-pump strategy without using the previously described scratching configuration shown in FIG. 6, an in situ accelerate evaporation device 800 can be placed at and above the boundary 810 between the crystallized material 132 and the ion solution 120, as shown in FIG. 8. The device 800 may include a housing 802, in which a propeller 804 is configured to rotate due to a motor 806. An air jet 808 is then directed by the housing 802 toward the boundary 810, to enhance the evaporation process. In one embodiment, either the device 800 or the substrate 110 is configured to move along arrows 812, relative to each other, so that the air jet 808 moves with the boundary 810. In this case, the MW crystallization rate can be accelerated and the upstream pump force pressure can be released. The release of the pump force would induce fluid flow acceleration 820, which could prevent nucleation from occurring in the middle of the channel, thereby eliminating MW discontinuities. This strategy can be adapted to quickly transport the ion solution 120 inside the Si micro-channels 112 and to reduce nucleation, while quick evaporation would release both the pump force and the trapping force. As shown in FIG. 4, the solution stream is separated well by the Si ridges 402, 404, indicating that the MWs 132 formed in the micro-channels 112 are free of discontinuities and overflow defects. It is assumed that, if the material volume did not change during the crystallization process, which would be the case if the phase changed from liquid (e.g., water) to solid (e.g., ice), no defects would exist.

In contrast to the traditional fabrication methods, the novel micro-pump fluidic method discussed herein is significantly cost-effective, simple, and feasible as it requires only filter papers between the source 122 and the patterned platform 110. Traditional methods reported in the literature used complicated fabrication processes for fabricating 1D MWs, and the resulted microwires have micrometer resolutions. For example, in these studies, photolithography was used to fabricate periodically aligned SU-8 photoresist stripes on the $SiO_2$/Si substrate, which acted as the template for the subsequently aligned growth of MWs and via traditional blade-coating/dip-coating methods.

In addition, the novel micro-pump approach benefits from self-assembly and auto- or self-growth technology based on the capillary force effect in micro-channels (carried out under the ambient conditions) without the need for the complexity of the photoresist and lithography methods and can be applied to any patterned solid platform with nanometer dimensions. In addition, the novel approach discussed herein does not generate any undesirable by-products; it is a zero-waste and contamination-free process as the filter paper could be easily cleaned and thus recycled by dipping it into the DMSO solution. Furthermore, this micro-pump process prevents the contamination of raw materials. Moreover, the LIL process used to fabricate the Si micro-channels is based on a cost-effective, simple, mask-free patterning technique, whereas traditional lithography is costly and complicated. Owing to its simplicity, the novel process disclosed herein does not require a mask aligner for fabricating periodically aligned micro-channels. In addition, transferring the MWs embedded in the Si micro-channels into another substrate is possible.

To determine the structural and optical properties of the perovskite MWs 132 embedded in the Si microchannel substrate 110, the inventors have carried out a transmission electron microscopy (TEM) analysis to ascertain the MW size and structural homogeneity. Thus, a cross-section of the perovskite MW/Si periodic array was prepared via the FIB technique. The examined uniform array comprised 14 MWs well separated by Si ridges 402/404. Each MW in this embodiment has a height of 1.5 mm and a width of 0.72 mm and is fully embedded in the Si channel with no interspaces or defects, further confirming the effectiveness of our micro-pump microfluidic method.

Figure 9:
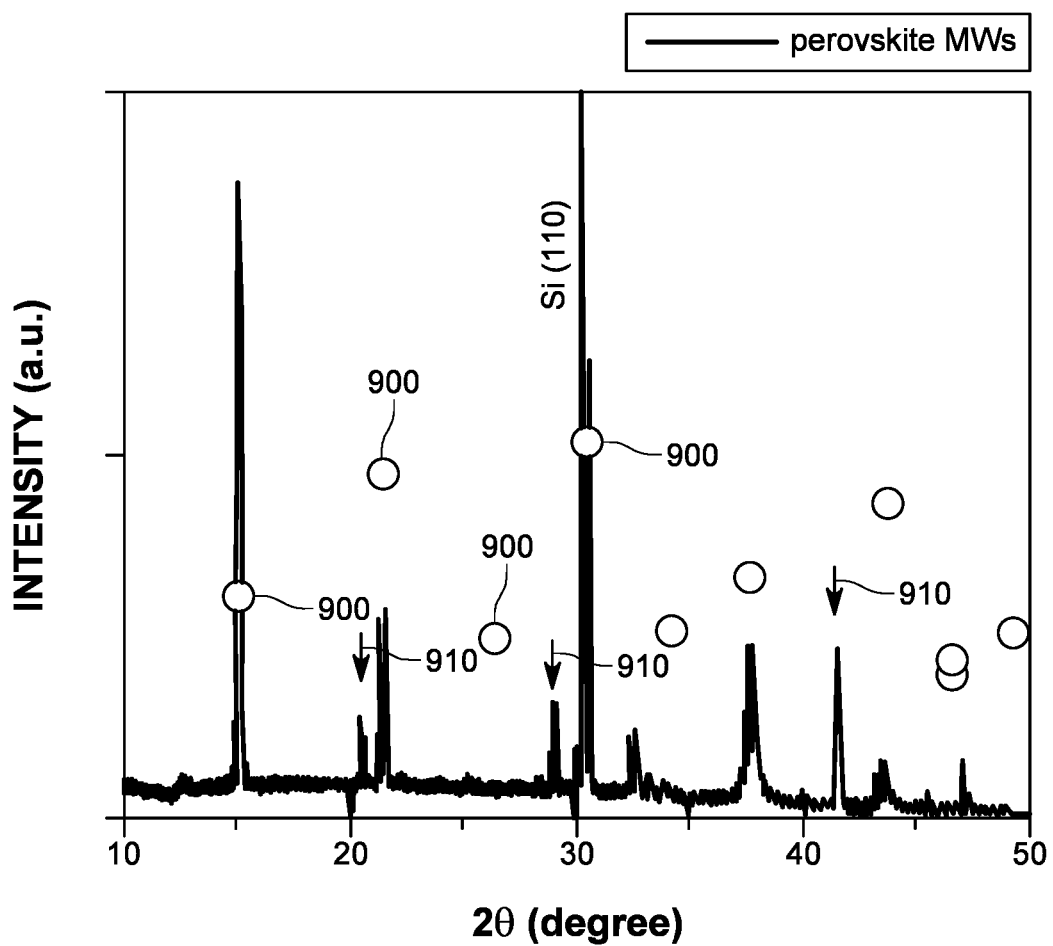
FIG. 9 shows the x-ray diffraction spectrum of the microwires embedded into the substrate.

The high-resolution TEM (HR-TEM) and the fast Fourier transform (FFT) results, which were measured for the perovskite MW/Si lamella prepared by SEM-FIB, suggest that the perovskite MW exhibits a major cubic crystalline structure with slight segregations. The X-ray diffraction (XRD) was performed to further confirm the crystalline quality of the perovskite MWs embedded in the micro-channel, as shown in FIG. 9. The peaks 900 match the XRD peaks of the typical cubic $CsPbBr_3$ structure. This result confirms that the main chemical compound of these MWs 132 is the $CsPbBr_3$, as observed in the HR-TEM images. The minor peaks 910, correspond to the CsBr segregation formed due to its low solubility in the DMSO solvent. As reported in the pertinent literature, the other obscure peaks can be associated with zero-dimensional perovskite $Cs_4PbBr_6$. These findings are in line with the HR-TEM results above, identifying the origin of the minor observed segregations. The existence of segregation and chemical phase in perovskite is determined by modifying the molar ratio of $PbBr_2$ and CsBr in the DMSO solvent that was suggested to be desired for improving the purity of the chemical phase.

Figure 10:
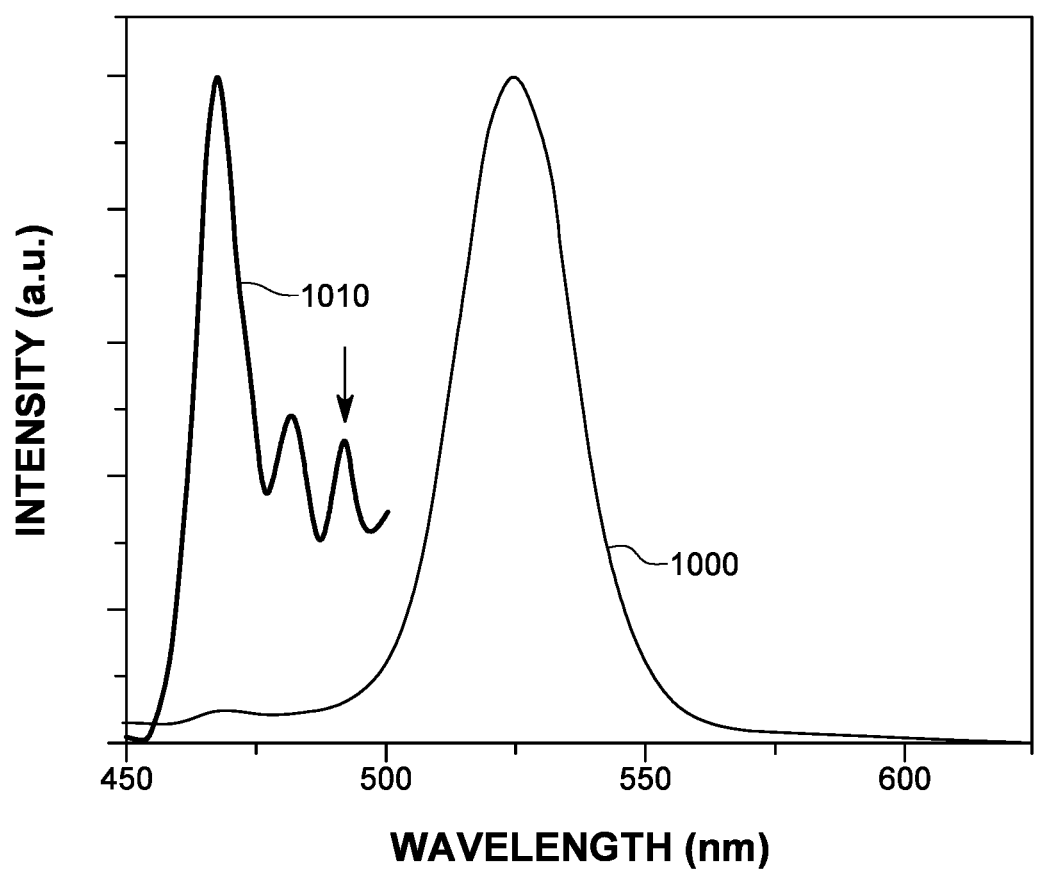
FIG. 10 shows the PL excitation and PL spectra of perovskite microwires embedded into the substrate.
Figure 11:
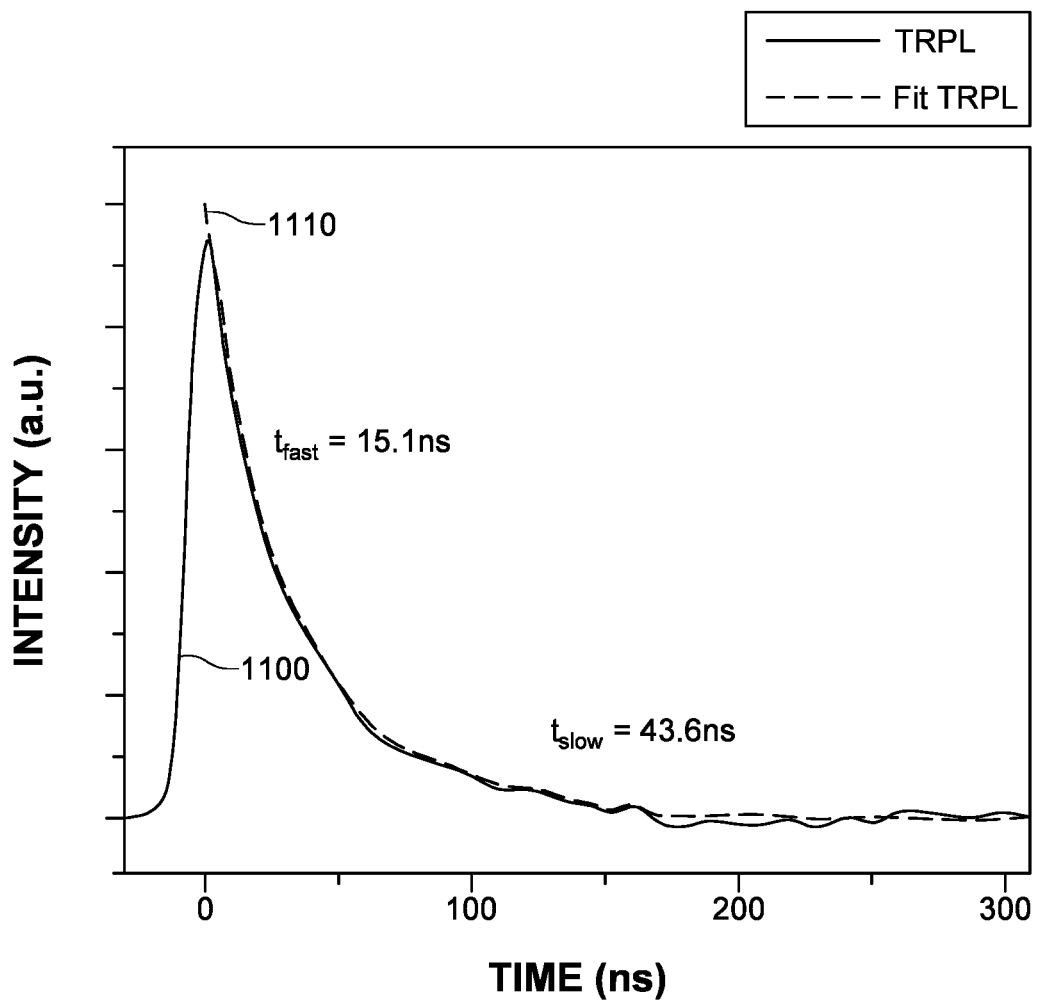
FIG. 11 shows the experimental and calculated time-resolved PL decay curves.

To investigate the optical quality of the perovskite MWs 132 embedded in the micro-channels 112, PL and time-resolved PL (TRPL) measurements were carried out at room temperature. FIG. 10 shows the PL spectrum 1000 of the perovskite MWs 132, indicating an intense emission peak centered at 524.5 nm with a full width at half-maximum (FWHM) of 26.2 nm. To study the origin of this peak, the PL excitation (PLE) spectrum 1010 at 492.4 nm shows a Stokes shift with respect to the PL peak, which is in line with the reported work for $CsPbBr_3$ nanocrystals. The lifetime decay curve 1100 is shown in FIG. 11. The lifetime components were obtained by fitting the experimental data 1100 to the biexponential lifetime decay model 1110. The calculated fast (15.1 ns) and slow (about 43.6 ns) lifetime components indicate different recombination centers related to trap-assisted and free charge carrier transition decay, respectively. The total lifetime of 38.4 ns is 8 times longer than that of pure $CsPbBr_3$ nanocrystals previously reported, indicating a higher radiative recombination rate in the perovskite MW array. Thus, these findings (including TEM and XRD results) indicate that the high optical and structural qualities of the perovskite MWs 132 confined in Si micro-channels 112 may comprise minor $Cs_4PbBr_6$ nanocrystals (segregations) resembling a $CsPbBr_3$ matrix.

Figure 12:
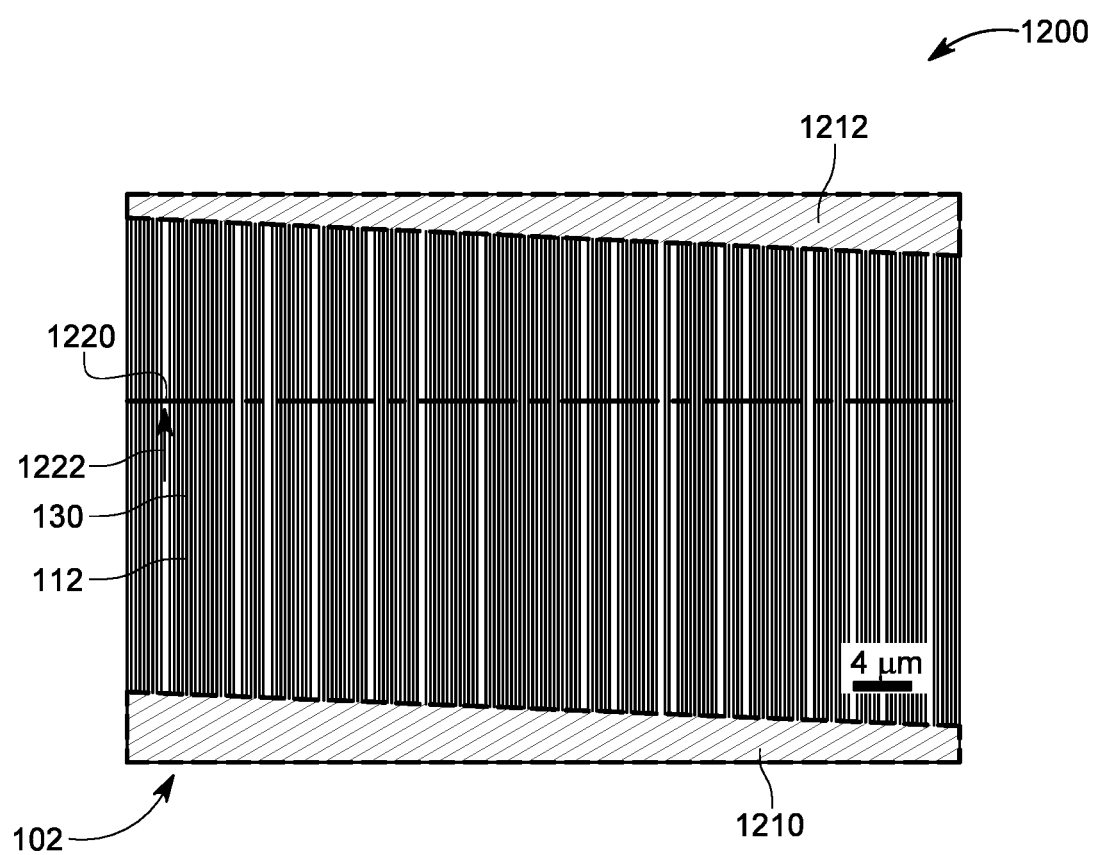
FIG. 12 shows a photodetector device that is based on the perovskite MWs embedded into the semiconductor substrate.

The novel MW/Si platform 102 can be used for making an optoelectronic device. For example, a PD device 1200 based on perovskite MWs 132 confined in the Si micro-channels 112 (acting as a semiconductor platform 102) was fabricated. A 300-nm-thick $SiO_2$ layer 114 was grown on the patterned Si micro-channels 112 via thermal oxidation (as show in FIG. 2), to ensure that no response is obtained from the Si substrate 110, while collecting responses only from the perovskite MWs 132. Then, the micro-pump method illustrated in FIG. 1A was used to form the MWs 132 confined in the $SiO_2$/Si micro-channels 112. Next, for metal contacts, Ti and Au interdigitated electrodes (IDEs) 1210 and 1212 of 100-nm thickness were deposited on top of the perovskite MWs 132 by magnetron sputtering assisted by a shadow mask, as shown in FIG. 12. FIG. 12 shows that 27 individual perovskite MWs 132 were created, each of which was in contact with the two electrodes 1210 and 1212. In one application, the interdigitated contact electrodes included four close parallel branches extending from two separate trunks. The channel length between the branches and the branch width was 30 and 950 mm, respectively. Note that line 1220 indicates the micro-channels 112 that were not filed with the perovskite material 130 while arrow 1222 show a completely filled micro-channel. The obtained PD 1200 was then tested to determine the transient curves at various bias voltages and the I-V performance.

Figure 13:
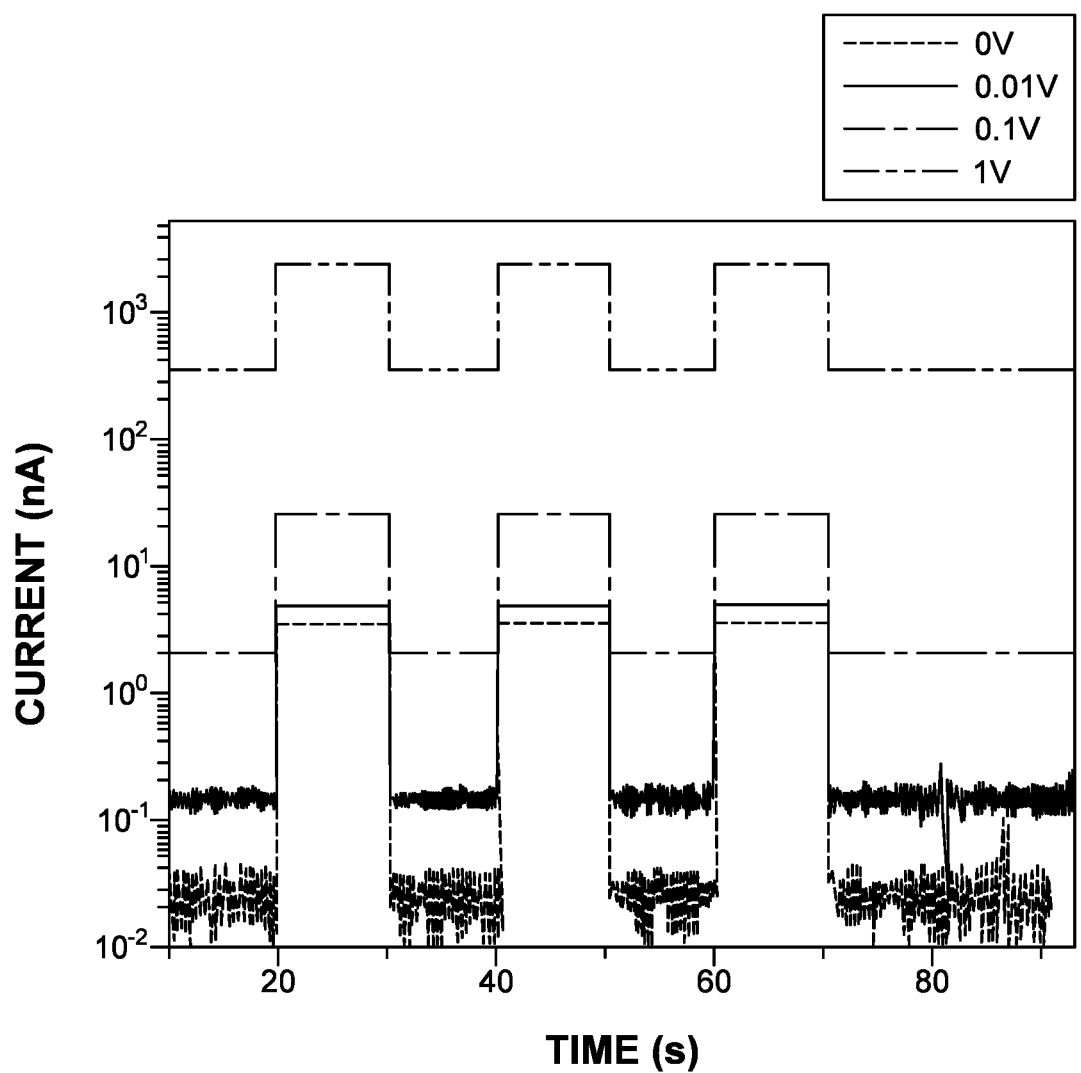
FIG. 13 shows the transient curves of a photodetector device at various bias voltages.
Figure 14:
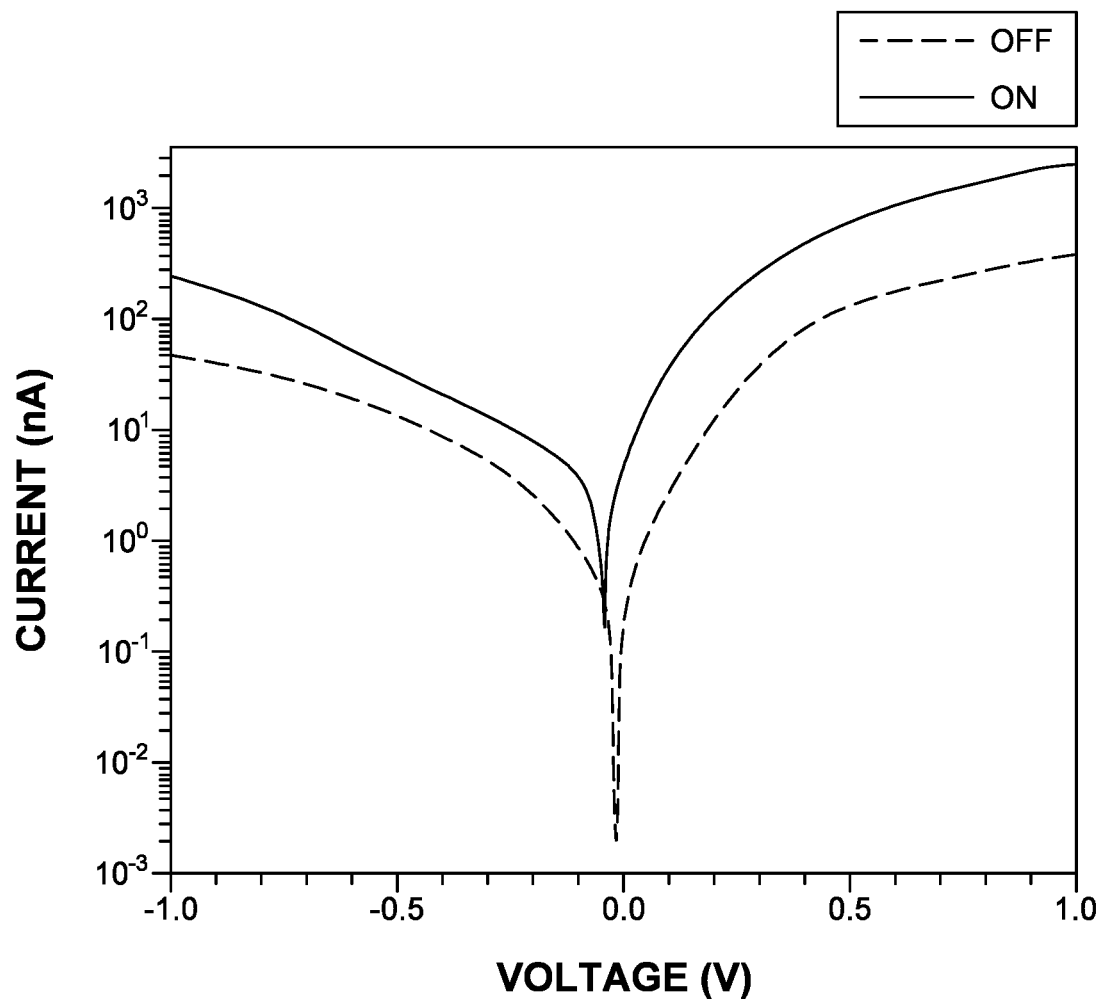
FIG. 14 shows the current-voltage performance of the photodetector device.

More specifically, FIG. 13 shows transient on/off cycles of photocurrents measured at various voltages (0.01, 0.1, and 1 V), as well as 0 V, based on a typical ohmic contact shown in the I-V curve (current-voltage characteristic curve) illustrated in FIG. 14. The results indicate that the PD device 1200 can work as a self-powered device. A 0.14-mW/cm$^2$ white light-emitting diode (LED) served as a light source. The resulting device 1200 was stable and was capable of reversible and rapid switching between the dark and the illuminated states. Exposure involving 140 on/off cycles resulted in a stable responsivity of about 0.96 NW. However, the high dark current is limited under high bias and needs to be optimized. If the dark current effect is ignored, then the photocurrent is as high as 1 mA under 1 V voltage bias, which is higher than the value previously reported for nanocrystal perovskite-based PDs. The high dark current at high bias can be attributed to two reasons. First, the interfacial defects between the perovskite material 130 and the SiO$_2$ 114 increase the dark current. Second, the inclusion of Cs$_4$PbBr$_6$ in CsPbBr$_3$ can reduce the photo-response, as the Cs$_4$PbBr$_6$ has a lower photo-response when compared to the CsPbBr$_3$.

Furthermore, the inventors performed a 10,000 Hz communication experiment, but no response was obtained, suggesting a 0.1 μs to less than 80 ms response time range, which is comparable to that of reported perovskite-based PDs. In general, the PD 1200's performance (including responsivity and response values) is higher than those in several reported works. In particular, the responsivity of the PD device 1200 is higher than that of previously reported self-powered, PD-based on perovskite. Thus, the novel microfluidic strategy shown in FIGS. 1A and 1B demonstrated high-performance MW-based PDs compared to previously reported PDs based on perovskite [14, 15] or other materials under low applied voltage.

The above embodiments disclose a cost-effective and superior micro-pump (microfluidic) strategy for fabricating well-aligned, parallel, perovskite MW arrays confined in a Si patterned (microchannels) platform. One possible advantage of the proposed strategy is its high-resolution and zero waste and chemical pollution, making it feasible for large-scale perovskite-based applications. Advanced optical and structural characterizations revealed the good quality of CsPbBr$_3$ MWs with minor inclusions of Cs$_4$PbBr$_6$ nanocrystals. Moreover, the successful fabrication of a highly sensitive self-powered PD based on these micro-pump-assisted perovskite MWs confirmed that this method can assist in producing 1D nanostructures whose characteristics can be adjusted by modifying the semiconductor microchannel dimensions, such as photovoltaic cells, high-density microcircuits, field-effect transistors, biosensors, waveguides, and mersisters. The simplicity and cost-effectiveness of this strategy (owing to room-temperature processing without the need for expensive facilities) would ensure its scalability.

Figure 15:
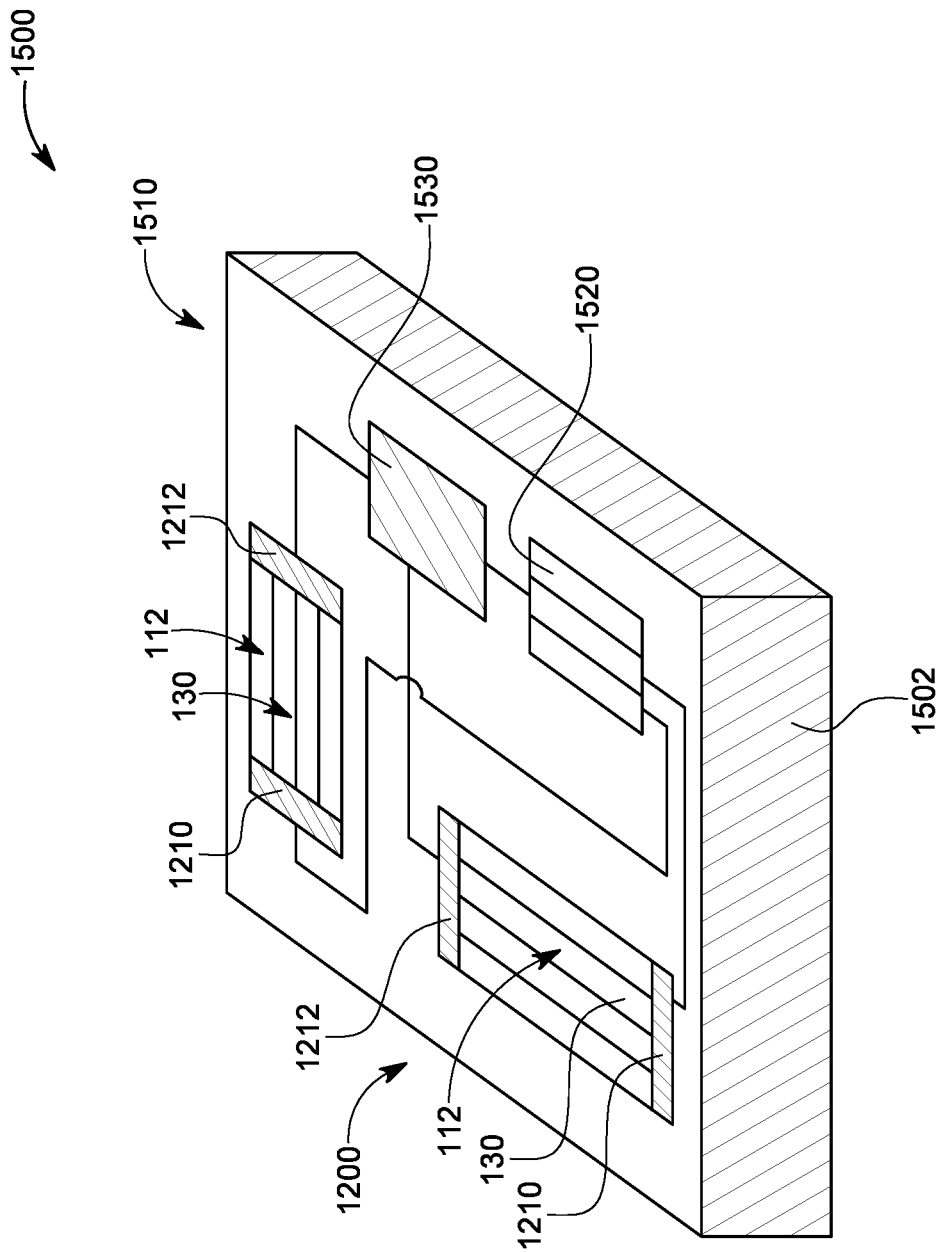
FIG. 15 shows a schematic diagram of a lab-on-chip device that is based on perovskite MWs embedded into a common semiconductor substrate.

In one embodiment, it is possible to use the method illustrated in FIGS. 1A and 1B and make a lab-on-chip device 1500, as illustrated in FIG. 15. The lab-on-chip device 1500 includes a single substrate 1502 on which various elements are embedded. For example, the PD device 1200 can be formed directly on the substrate 1502. Another sensor 1510 may be formed directly on the substrate 1502, and the sensor 1510 may be made with the method shown in FIGS. 1A and 1B, but may be used as another type of sensor. Any other sensor may be implemented on the substrate 1502, for example, a transistor, light-emitting diode, or a solar cell, a laser device, etc. Each or any of these devices may be manufactured on the common substrate with the method illustrated in FIGS. 1A and 1B. A battery 1520 may also be manufactured directly on the substrate with the method of FIGS. 1A and 1B and connected to the various sensors to provide electrical energy. For example, the battery 1520 may be a solar cell that has perovskite MWs 132 formed in the micro-channels 112 of the substrate 1502. A processor 1530 that includes at least a transistor may also be formed directly on the substrate 1502, either by the existing lithographic methods or by using the procedure illustrated in FIGS. 1A and 1B. One skilled in the art would understand that for a Si substrate, any known semiconductor device may be formed on the substrate and integrated with the perovskite MW based device 1200. Also, those skilled in the art would understand that other ion-crystal semiconductor materials may be used instead of the perovskite material to form the MW of the device 1200. In one application, the processor 1530 receives a measurement from the device 1200 and the battery (solar cell) 1520 supplies electrical energy to both the device 1200 and the processor 1530.

Figure 16:
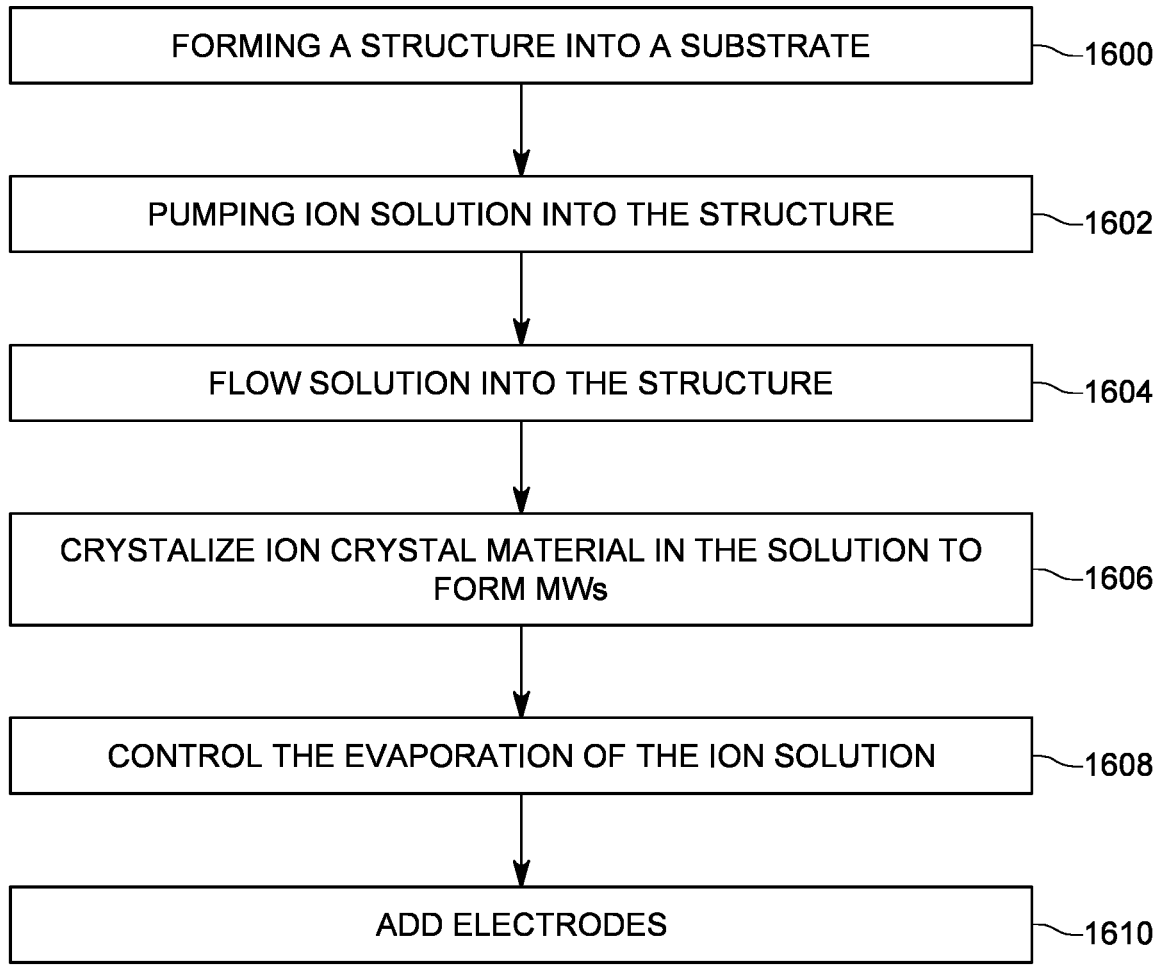
FIG. 16 is a flow chart of a method for making the perovskite MWs embedded into a semiconductor substrate.

A method for making any perovskite MWs based semiconductor device is now discussed with regard to FIG. 16. The method includes a step 1600 of forming one or more structures 112 in a semiconductor substrate 110. The structure 112 has been shows in FIG. 1A to be straight, parallel, micro-channels, and in FIG. 1B to be straight, parallel, micro-channels, non-straight channels, and/or reservoirs. Other shapes may be used, for example, trenches having non-parallel sides, etc. The formation of these structures 112 in the substrate 110 may be accomplished with any known method, in addition to the LIL method discussed above with regard to FIG. 2. Any combination of such manufacturing methods may be used.

After the surface of the semiconductor substrate 110 is shaped to obtain the desired structures 112/112-2/113/124/126, an ion solution 120 is pumped with the micro-pump 140, from a container 122, to the structures 112/112-2/113/124/126. If the substrate 110 is made from a material which may interact (electrically or optically) with the final MWs 132, then it is possible, in an optional step, to first coat the interior surface of the structure 112/112-2/113/124/126 with an oxide film, e.g., SiO$_2$ 114, to insulate the two materials from each other. Other coatings may be added as deemed necessary. The ion solution 120 could be any perovskite material 130, but also could include other materials, for example, an ion-crystal semiconductor material. A combination of perovskite materials may be used. The ion-crystal semiconductor material 130 is provided in a solution so that the capillarity of the micro-pump 140 takes the solution from the container 122 to the structures 112/112-2/113/124/126. Note that the material 130 is mixed up with a solvent (e.g., DMSO) to form the ion solution 120. In one embodiment, lead-halide-based perovskite material 130 is used for the ion solution 120. In one optional step, the evaporation rate of the ion-crystal semiconductor material 130 is determined and the micro-pump 140 is sized to pump enough solution 120 to replace the evaporated solvent. The size of the micro-pump 140 dictates how much of the ion solution 120 is transferred from the container 122 to the structure 112/112-2/113/124/126 as the capillaries formed in the micro-pump 140 determine the amount of solution transferred. In one application, the capillaries are supplied by a paper filter 144, which is held in place by a strong substrate 142, for example glass. However, one skilled in the art would recognize that any material that is inexpensive and have natural capillaries would be able to act as the micro-pump. If the selected capillary material is strong enough, no substrate 142 is necessary.

In step 1604, the ion solution 120 flows from a first end 110A (proximal end) of the substrate 110 to a second end 110B (distal end), which is opposite to the first end 110A. The flow happens because of the narrow width of the structure 112/112-2/113/124/126, which is in the range of 0.1-10 µm. In one application, the width of the structure is less than 1 µm, except for the reservoirs, which can be up to 100 µm. If large reservoirs are used, in one application, the substrate 110 may be tilted to promote the flow of the ion solution through the reservoirs. A height of the structure is between 1-10 µm. In one application, the height of the structure is less than 2 µm, for example, 1.5 µm. The distal ends of the structure 112/112-2/113/124/126 may be closed, so that when the ion solution 120 arrives at these ends, the flow of the ion solution at the distal end stops. Once this happens, the flow upstream the distal end happens only because of the evaporation of the solvent of the ion solution 120. Thus, in this step, the flow of the ion solution is desired to just replace the evaporated solvent to avoid spills or interruptions in the fluid, which will be the origin for discontinuities and imperfections in the MWs to be formed.

In step 1606, the ion-crystal semiconductor material 130 in the ion solution 120 starts to crystalize and form MWs 132. If the material 130 includes perovskite, the MWs that are formed inside the structure are perovskite MWs. The MW follow the shape of the structure 112/112-2/113. Thus, by controlling the shape and size of the structure 112/112-2/113, the shape and the size of the MWs is controlled. Therefore, the MWs 132 can have a width and/or height in the µm range. However, in one embodiment, it is possible that the MWs 132 have a width and/or height in the nm range, if the structure 112 is so sized.

An interface 810 between the crystalized material, i.e., the MWs 132 and the ion solution 120 in a given micro-channel 112 moves from the distal end to the proximal end of the micro-channel 112. In step 1608, an evaporation rate of the ion solution 120 at the interface 810 may be controlled with an accelerate evaporation device 800, which with an air jet moves faster the air above the interface 810 for facilitating the evaporation of the solvent. Thus, in step 1608, it is possible to control the evaporation rate of the solvent in the ion solution 120. Note that because the ion-crystal semiconductor material 130 is formed in the structure 112/112-2/113/124/126, and there is no direct handling of the formed MWs 132, there is no danger of breaking the MWs, especially when the MWs are brittle. Thus, in this embodiment, there is no movement or touching of the MWs while they are being made or after being made. In one application, the controlled evaporation rate is correlated with the amount of ion solution 120 that is pumped into the structure 112. In other words, the size if the filter paper 144 is selected so that the ion solution carried by capillarity by the filter paper 144 substantially balances the evaporated solvent.

Once the MWs have been made, i.e., the perovskite material has crystalized and the MWs are solid, a first electrode 1210 is added in step 1610 to the proximal end of the structure 112/112-2/113/124/126 and a second electrode 1212 is added to the distal end of the structure 112/112-2/113/124/126 to form an electrical circuit. The ends of the electrodes may be used to connect to other elements formed on the substrate 110, for example, a solar cell, a transistor, a PD, etc. depending on the needs. In one application, the exposed surface of the MWs may be covered with a protective and/or transparent material.

The disclosed embodiments provide a method for forming ion-crystal semiconductor material MWs embedded into a semiconductor platform based on a micro-pump fluidic strategy, and/or making a semiconductor device based on the perovskite MWs. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

The entire content of all the publications listed herein is incorporated by reference in this patent application.
[1] A. Zaher, S. Li, O. Yassine, N. Khashab, N. Pirmoradi, L. Lin, J. Kosel: "Osmotically driven drug delivery through remote-controlled magnetic nanocomposite membranes". *Biomicrofluidics*, vol. 9, no. 5, p. 054113, 2015.
[1] Zhang, H., Nazeeruddin, M. K., and Choy, W. C. H. (2019). Perovskite Photovoltaics: The Significant Role of Ligands in Film Formation, Passivation, and Stability. *Adv. Mater.* 31, e1805702.
[2] Veldhuis, S. A., Boix, P. P., Yantara, N., Li, M., Sum, T. C., Mathews, N., and Mhaisalkar, S. G. (2016). Perovskite Materials for Light-Emitting Diodes and Lasers. Adv. Mater. 28, 6804-6834.
[3] Sutherland, B. R., and Sargent, E. H. (2016). Perovskite photonic sources. Nat. Photonics 10, 295-302.
[4] Xin, B., Pak, Y., Mitra, S., Almalawi, D., Alwadai, N., Zhang, Y., and Rogan, I. S. (2019). Self-Patterned CsPbBr3 Nanocrystals for High-Performance Optoelectronics. ACS Appl. Mater. Interfaces 11, 5223-5231.
[5] Shi, D., Adinolfi, V., Comin, R., Yuan, M., Alarousu, E., Buin, A., Chen, Y., Hoogland, S., Rothenberger, A., Katsiev, K., et al. (2015). Solar cells. Low trap-state density and long carrier diffusion in organolead trihalide perovskite single crystals. Science 347, 519-522.
[6] Yan, C., Su, B., Shi, Y., and Jiang, L. (2019). Liquid bridge induced assembly (LBIA) strategy: Controllable one-dimensional patterning from small molecules to macromolecules and nanomaterials. Nano Today 25, 13-26.

[7] Feng, J., Yan, X., Zhang, Y., Wang, X., Wu, Y., Su, B., Fu, H., and Jiang, L. (2016). "Liquid Knife" to Fabricate Patterning Single-Crystalline Perovskite Microplates toward High-Performance Laser Arrays. Adv. Mater. 28, 3732-3741.

[8] Dai, Z., Ou, Q., Wang, C., Si, G., Shabbir, B., Zheng, C., Wang, Z., Zhang, Y., Huang, Y., and Dong, Y. (2019). Capillary-bridge mediated assembly of aligned perovskite quantum dots for high-performance photodetectors. J. Mater. Chem. C Mater. Opt. Electron. Devices 7, 5954-5961.

[9] Gao, H., Feng, J., Zhang, B., Xiao, C., Wu, Y., Kan, X., Su, B., Wang, Z., Hu, W., and Sun, Y. (2017). Capillary-Bridge Mediated Assembly of Conjugated Polymer Arrays toward Organic Photodetectors. Adv. Funct. Mater. 27, 1701347.

[10] Zhou, Q., Park, J. G., Nie, R., Thokchom, A. K., Ha, D., Pan, J., Seok, S. I., and Kim, T. (2018). Nanochannel-Assisted Perovskite Nanowires: From Growth Mechanisms to Photodetector Applications. ACS Nano 12, 8406-8414.

[11] Wang, Y., Li, M., Li, H., Lan, Y., Zhou, X., Li, C., Hu, X., and Song, Y. (2019). Patterned Wettability Surface for Competition-Driving Large-Grained Perovskite Solar Cells. Adv. Energy Mater. 9, 1900838.

[12] Wu, W., Wang, X., Han, X., Yang, Z., Gao, G., Zhang, Y., Hu, J., Tan, Y., Pan, A., and Pan, C. (2019). Flexible Photodetector Arrays Based on Patterned CH3NH3PbI3-xClx Perovskite Film for Real-Time Photosensing and Imaging. Adv. Mater. 31, 1805913.

[13] Deng, W., Jie, J., Xu, X., Xiao, Y., Lu, B., Zhang, X., and Zhang, X. (2020). A Microchannel-Confined Strategy Enables Blade Coating of Perovskite Single Crystal Arrays for Device Integration. Adv. Matter. 32, 1908340.

[14] Song, J., Xu, L., Li, J., Xue, J., Dong, Y., Li, X., and Zeng, H. (2016). Monolayer and Few-Layer All-Inorganic Perovskites as a New Family of Two-Dimensional Semiconductors for Printable Optoelectronic Devices. Adv. Mater. 28, 4861-4869.

[15] Maculan, G., Sheikh, A. D., Abdelhady, A. L., Saidaminov, M. I., Haque, M. A., Murali, B., Alarousu, E., Mohammed, O. F., Wu, T., and Bakr, O. M. (2015). $CH_3NH_3PbCl_3$ single crystals: inverse temperature crystallization and visible-blind UV-photodetector. J. Phys. Chem. Lett. 6, 3781-3786.

What is claimed is:

1. A lab-on-chip device comprising:
a semiconductor substrate;
a power source integrated into the semiconductor substrate;
a sensor integrated into the semiconductor substrate; and
a processor integrated into the semiconductor substrate,
wherein the processor is configured to receive a measurement from the sensor and the power source is configured to supply electrical power to the sensor and the processor,
wherein each of the power source, the sensor, and the processor comprises a plurality of micro- and/or nanowires, MNWs, embedded in corresponding plurality of micro-channels, which extend along a surface of the semiconductor substrate, and
wherein each of a width and a depth of each micro-channel of the plural micro-channels is less than 10 μm.

2. The device of claim 1, wherein each MNW of the plural MNWs includes an ion-crystal semiconductor material.

3. The device of claim 1, wherein the plural micro-channels are parallel, linear, micro-channels.

4. The device of claim 3, further comprising:
additional micro-channels that are non-linear.

5. The device of claim 1, wherein a width of each micro-channel of the micro-channels is less than 1 μm.

6. The device of claim 1, further comprising:
an oxide layer provided between the plural micro-channels and the plural MNWs.

7. The device of claim 1, wherein each MNW of the plural MNWs includes a perovskite material.

* * * * *